United States Patent
Williams et al.

(10) Patent No.: US 10,637,289 B2
(45) Date of Patent: Apr. 28, 2020

(54) SYSTEMS AND METHODS FOR IMPROVED PHASE DETERMINATIONS IN WIRELESS POWER DELIVERY ENVIRONMENTS

(71) Applicant: Ossia Inc., Bellevue, WA (US)

(72) Inventors: Douglas Williams, Bellevue, WA (US); Rasha Qamheyeh, Bellevue, WA (US); Hatem Zeine, Bellevue, WA (US); Dale Donald Mayes, Bothell, WA (US)

(73) Assignee: Ossia Inc., Bellevue, WA (US)

( * ) Notice: Subject to any disclaimer, the term of this patent is extended or adjusted under 35 U.S.C. 154(b) by 91 days.

(21) Appl. No.: 15/888,342

(22) Filed: Feb. 5, 2018

(65) Prior Publication Data

US 2018/0159373 A1 Jun. 7, 2018

Related U.S. Application Data

(63) Continuation of application No. 15/246,778, filed on Aug. 25, 2016, now Pat. No. 9,887,589.

(60) Provisional application No. 62/209,864, filed on Aug. 25, 2015.

(51) Int. Cl.
| | |
|---|---|
| *H02J 50/10* | (2016.01) |
| *H02J 50/80* | (2016.01) |
| *G01R 31/36* | (2020.01) |
| *G01R 29/08* | (2006.01) |
| *H02J 7/02* | (2016.01) |
| *H04B 5/00* | (2006.01) |

(52) U.S. Cl.
CPC .......... *H02J 50/10* (2016.02); *G01R 29/0892* (2013.01); *G01R 31/3646* (2019.01); *H02J 7/025* (2013.01); *H02J 50/80* (2016.02); *H04B 5/0037* (2013.01)

(58) Field of Classification Search
USPC ............... 324/617, 709, 76.52, 76.77, 76.82
See application file for complete search history.

(56) References Cited

U.S. PATENT DOCUMENTS

| | | |
|---|---|---|
| 6,154,176 A | 11/2000 | Fathy et al. |
| 2002/0135513 A1 | 9/2002 | Paschen et al. |
| 2005/0142957 A1 | 6/2005 | Bystrom |
| 2006/0043915 A1 | 3/2006 | Kim |
| 2009/0103675 A1* | 4/2009 | Yousefi Moghaddam ................. H03L 7/0995 375/376 |
| 2010/0195603 A1 | 8/2010 | Ho |
| 2013/0049732 A1 | 2/2013 | Kulkarni et al. |

(Continued)

*Primary Examiner* — Vincent Q Nguyen

(57) ABSTRACT

Systems and methods for improvement in transmission antenna design and, more particularly, for rapid determine phase determination of incoming signals are described herein. In some embodiments, a phase detection system is described. The phase detection system includes a phase detection apparatus and a control system. The phase detection apparatus includes a phase shifting element and a phase detector element. The phase shifting element is configured to phase-shift a reference signal multiple times per detection cycle. The phase detector element is configured to compare an incoming signal to multiple phases of the phase-shifted reference signal during the detection cycle, and generate an output indicating a relative phase difference between the incoming signal and the phase-shifted reference signal for each of the multiple phases. The control system is configured to determine a relative phase of the incoming signal based, at least in part, on the outputs.

20 Claims, 13 Drawing Sheets

(56) References Cited

U.S. PATENT DOCUMENTS

| | | | |
|---|---|---|---|
| 2013/0051446 A1 | 2/2013 | Vijayasankar et al. | |
| 2013/0223566 A1 | 8/2013 | Linn | |
| 2013/0271221 A1 | 10/2013 | Levesque et al. | |
| 2014/0070764 A1* | 3/2014 | Keeling | H04B 5/0037 320/108 |
| 2016/0191121 A1* | 6/2016 | Bell | H04B 5/0037 307/104 |

* cited by examiner

SYSTEMS AND METHODS FOR IMPROVED PHASE DETERMINATIONS IN WIRELESS POWER DELIVERY ENVIRONMENTS

CROSS-REFERENCE TO RELATED APPLICATIONS

This application is a continuation of U.S. patent application Ser. No. 15/246,778 titled "SYSTEMS AND METHODS FOR IMPROVED PHASE DETERMINATIONS IN WIRELESS POWER DELIVERY ENVIRONMENTS" filed on Aug. 25, 2016; which claims priority to and benefit from U.S. Provisional Patent Application No. 62/209,864 titled "SYSTEMS AND METHODS FOR IMPROVED TECHNIQUES AND APPLICATIONS FOR WIRELESS POWER TRANSFERS" filed on Aug. 25, 2015, both of which are expressly incorporated by reference herein.

TECHNICAL FIELD

The technology described herein relates generally to the field of wireless power transmission and, more specifically, to systems and methods for improved phase determinations in wireless power delivery environments.

BACKGROUND

Many electronic devices are powered by batteries. Rechargeable batteries are often used to avoid the cost of replacing conventional dry-cell batteries and to conserve precious resources. However, recharging batteries with conventional rechargeable battery chargers requires access to an alternating current (AC) power outlet, which is sometimes not available or not convenient. It would, therefore, be desirable to derive power for electronics wirelessly.

In the field of wireless charging, safe and reliable use within a business or home environment is of the utmost concern. To date, wireless charging has been limited to magnetic or inductive charging based solutions. Unfortunately, these solutions require a wireless power transmission system and a receiver to be in relatively close proximity to one another. Wireless power transmission at larger distances requires more advanced mechanisms such as, for example, transmission via radio frequency (RF) signals, ultrasonic transmissions, laser powering, to name a few, each of which presents a number of unique hurdles to commercial success.

The most viable systems to date utilize power transmission via RF. However, in the context of RF transmission within a residence, commercial building, or other habited environment, there are many reasons to limit the RF exposure levels of the transmitted signals. Consequently, power delivery is constrained to relatively low power levels (typically on the order of milliWatts). Due to this low energy transfer rate, it is imperative that the system is efficient.

In a free space wireless environment, radiation from an omnidirectional radiator or antenna propagates as an expanding sphere. The power density is reduced as the surface area of the sphere increases in the ratio of $1/r^2$ where r is the radius of the sphere. This type of radiator is often referred to as isotropic, with an omnidirectional radiation pattern, and it is usual to refer to antennas in terms of their directivity vs. gain as dBi—decibels over isotropic. If the intended receiver of the transmission is at a particular point relative to the transmitting radiator, being able to direct the power towards an intended receiver means that more power will be available at the receiving system for a given distance than would have been the case if the power had been omnidirectional radiated. This concept of directivity is very important because it improves the system performance. A very simple analog is seen in the use of a small lamp to provide light and the effect of directing the energy using a reflector or lens to make a flashlight where the power is used to illuminate a preferred region at the expense of having little to no illumination elsewhere.

Central to mechanisms for directionally focusing transmissions is the ability to rapidly and efficiently determine transmission phase, and alter outgoing transmission phase. Phase detection is likewise useful for activities such as detecting changes in a charging environment, such as detection of movement of an antenna within the environment. Movement detection allows for more efficient beaconing, and power transmission scheduling.

Accordingly, a need exists for technology that overcomes the problem demonstrated above, as well as one that provides additional benefits. The examples provided herein of some prior or related systems and their associated limitations are intended to be illustrative and not exclusive. Other limitations of existing or prior systems will become apparent to those of skill in the art upon reading the following Detailed Description.

Overview

Examples discussed herein relate to a phase detection systems and methods for rapid phase determination of incoming signals. In some embodiments, the phase detection system includes a phase detection apparatus and a control system. The phase detection apparatus includes a phase shifting element and a phase detector element. The phase shifting element is configured to phase-shift a reference signal multiple times per detection cycle. The phase detector element is configured to compare an incoming signal to multiple phases of the phase-shifted reference signal during the detection cycle, and generate an output indicating a relative phase difference between the incoming signal and the phase-shifted reference signal for each of the multiple phases. The control system is configured to determine a relative phase of the incoming signal based, at least in part, on the outputs.

In some embodiments, a method for rapid phase determination of incoming signals is described. The method includes generating a reference signals at three or more phases wherein the phases are known, detecting a beacon signal, adjusting the amplitudes of the reference signals and the beacon signal until the amplitudes are roughly aligned, comparing each of the three reference signals phases to the beacon signal to generate direct current outputs to a digital controller, and calculating the beacon signal's phase using the known phases and corresponding direct current outputs.

This Overview is provided to introduce a selection of concepts in a simplified form that are further described below in the Technical Disclosure. It may be understood that this Overview is not intended to identify key features or essential features of the claimed subject matter, nor is it intended to be used to limit the scope of the claimed subject matter.

BRIEF DESCRIPTION OF THE DRAWINGS

One or more embodiments of the present invention are illustrated by way of example and not limitation in the figures of the accompanying drawings, in which like references indicate similar elements.

DETAILED DESCRIPTION

Figure 1:
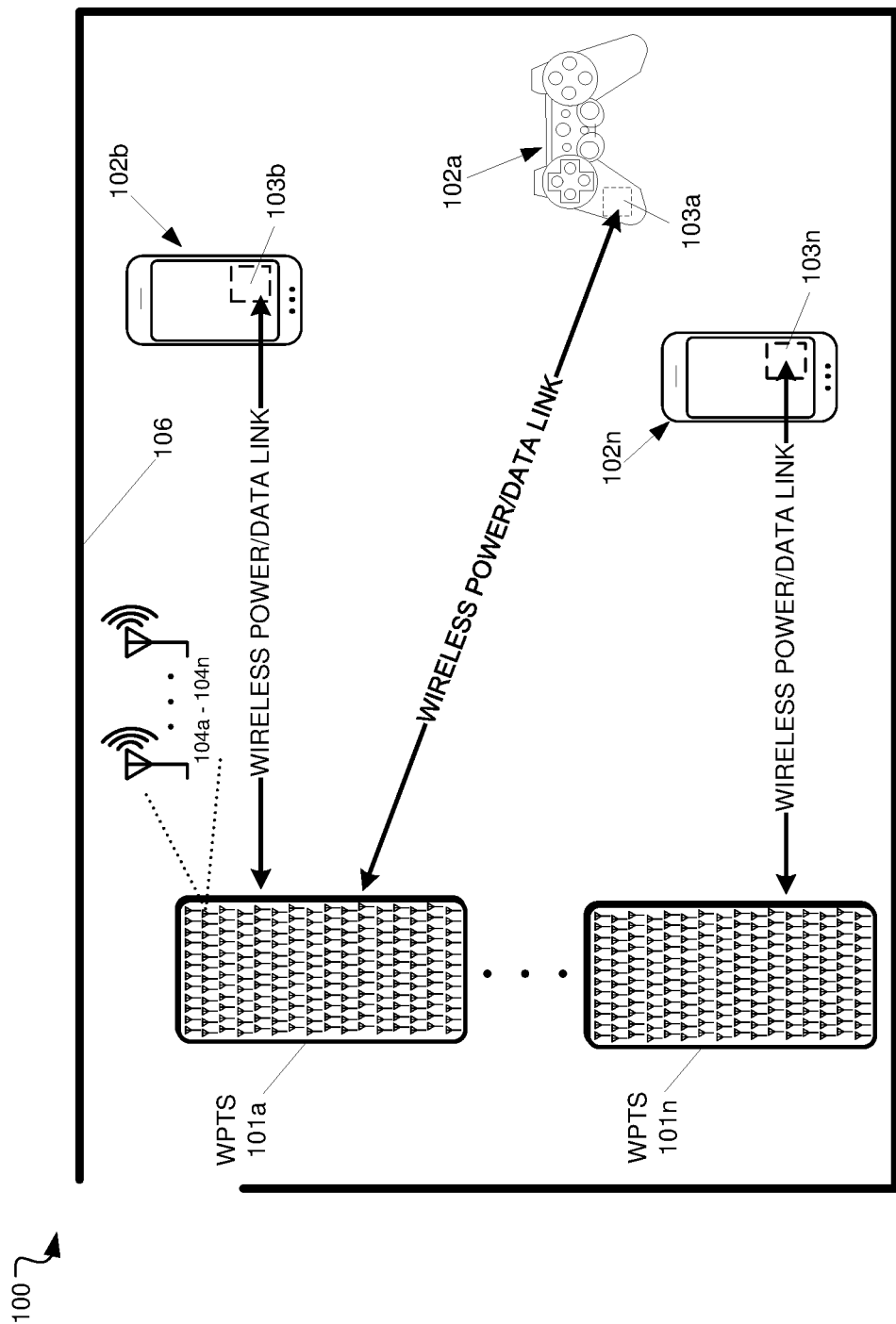
FIG. 1 depicts an example wireless power delivery environment illustrating wireless power delivery from one or more wireless power transmission systems to various wireless devices within the wireless power delivery environment in accordance with some embodiments.

The following description and drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be, but not necessarily are, references to the same embodiment; and, such references mean at least one of the embodiments.

Systems and methods for improvement in transmission antenna design and, more particularly, for rapid determine phase determination of incoming signals are described herein. In some embodiments, a phase detection system is described. The phase detection system includes a phase detection apparatus and a control system. The phase detection apparatus includes a phase shifting element and a phase detector element. The phase shifting element is configured to phase-shift a reference signal multiple times per detection cycle. The phase detector element is configured to compare an incoming signal to multiple phases of the phase-shifted reference signal during the detection cycle, and generate an output indicating a relative phase difference between the incoming signal and the phase-shifted reference signal for each of the multiple phases. The control system is configured to determine a relative phase of the incoming signal based, at least in part, on the outputs.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but no other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and is not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

I. Wireless Power Transmission System Overview/Architecture

FIG. 1 depicts a block diagram including an example wireless power delivery environment 100 illustrating wireless power delivery from one or more wireless power transmission systems (WPTS) 101*a*-*n* (also referred to as "wireless power delivery systems", "antenna array systems" and "wireless chargers") to various wireless devices 102*a*-*n* within the wireless power delivery environment 100, according to some embodiments. More specifically, FIG. 1 illustrates an example wireless power delivery environment 100 in which wireless power and/or data can be delivered to available wireless devices 102*a*-102*n* having one or more wireless power receiver clients 103*a*-103*n* (also referred to herein as "clients" and "wireless power receivers"). The wireless power receiver clients are configured to receive and process wireless power from one or more wireless power transmission systems 101a-101n. Components of an example wireless power receiver client 103 are shown and discussed in greater detail with reference to FIG. 4.

As shown in the example of FIG. 1, the wireless devices 102a-102n include mobile phone devices and a wireless game controller. However, the wireless devices 102a-102n can be any device or system that needs power and is capable of receiving wireless power via one or more integrated power receiver clients 103a-103n. As discussed herein, the one or more integrated power receiver clients receive and process power from one or more wireless power transmission systems 101a-101n and provide the power to the wireless devices 102a-102n (or internal batteries of the wireless devices) for operation thereof.

Each wireless power transmission system 101 can include multiple antennas 104a-n, e.g., an antenna array including hundreds or thousands of antennas, which are capable of delivering wireless power to wireless devices 102. In some embodiments, the antennas are adaptively-phased radio frequency (RF) antennas. The wireless power transmission system 101 is capable of determining the appropriate phases with which to deliver a coherent power transmission signal to the power receiver clients 103. The array is configured to emit a signal (e.g., continuous wave or pulsed power transmission signal) from multiple antennas at a specific phase relative to each other. It is appreciated that use of the term "array" does not necessarily limit the antenna array to any specific array structure. That is, the antenna array does not need to be structured in a specific "array" form or geometry. Furthermore, as used herein the term "array" or "array system" may be used include related and peripheral circuitry for signal generation, reception and transmission, such as radios, digital logic and modems. In some embodiments, the wireless power transmission system 101 can have an embedded Wi-Fi hub for data communications via one or more antennas or transceivers.

The wireless devices 102 can include one or more receive power clients 103. As illustrated in the example of FIG. 1, power delivery antennas 104a-104n are shown. The power delivery antennas 104a are configured to provide delivery of wireless radio frequency power in the wireless power delivery environment. In some embodiments, one or more of the power delivery antennas 104a-104n can alternatively or additionally be configured for data communications in addition to or in lieu of wireless power delivery. The one or more data communication antennas are configured to send data communications to and receive data communications from the power receiver clients 103a-103n and/or the wireless devices 102a-102n. In some embodiments, the data communication antennas can communicate via Bluetooth™, Wi-Fi™, ZigBee™, etc. Other data communication protocols are also possible.

Each power receiver client 103a-103n includes one or more antennas (not shown) for receiving signals from the wireless power transmission systems 101a-101n. Likewise, each wireless power transmission system 101a-101n includes an antenna array having one or more antennas and/or sets of antennas capable of emitting continuous wave or discrete (pulse) signals at specific phases relative to each other. As discussed above, each the wireless power transmission systems 101a-101n is capable of determining the appropriate phases for delivering the coherent signals to the power receiver clients 102a-102n. For example, in some embodiments, coherent signals can be determined by computing the complex conjugate of a received beacon (or calibration) signal at each antenna of the array such that the coherent signal is phased for delivering power to the particular power receiver client that transmitted the beacon (or calibration) signal.

Although not illustrated, each component of the environment, e.g., wireless device, wireless power transmission system, etc., can include control and synchronization mechanisms, e.g., a data communication synchronization module. The wireless power transmission systems 101a-101n can be connected to a power source such as, for example, a power outlet or source connecting the wireless power transmission systems to a standard or primary alternating current (AC) power supply in a building. Alternatively, or additionally, one or more of the wireless power transmission systems 101a-101n can be powered by a battery or via other mechanisms, e.g., solar cells, etc.

The power receiver clients 102a-102n and/or the wireless power transmission systems 101a-101n are configured to operate in a multipath wireless power delivery environment. That is, the power receiver clients 102a-102n and the wireless power transmission systems 101a-101n are configured to utilize reflective objects 106 such as, for example, walls or other RF reflective obstructions within range to transmit beacon (or calibration) signals and/or receive wireless power and/or data within the wireless power delivery environment. The reflective objects 106 can be utilized for multi-directional signal communication regardless of whether a blocking object is in the line of sight between the wireless power transmission system and the power receiver client.

As described herein, each wireless device 102a-102n can be any system and/or device, and/or any combination of devices/systems that can establish a connection with another device, a server and/or other systems within the example environment 100. In some embodiments, the wireless devices 102a-102n include displays or other output functionalities to present data to a user and/or input functionalities to receive data from the user. By way of example, a wireless device 102 can be, but is not limited to, a video game controller, a server desktop, a desktop computer, a computer cluster, a mobile computing device such as a notebook, a laptop computer, a handheld computer, a mobile phone, a smart phone, a PDA, a Blackberry device, a Treo, and/or an iPhone, etc. By way of example and not limitation, the wireless device 102 can also be any wearable device such as watches, necklaces, rings or even devices embedded on or within the customer. Other examples of a wireless device 102 include, but are not limited to, safety sensors (e.g., fire or carbon monoxide), electric toothbrushes, electronic door lock/handles, electric light switch controller, electric shavers, etc.

Although not illustrated in the example of FIG. 1, the wireless power transmission system 101 and the power receiver clients 103a-103n can each include a data communication module for communication via a data channel. Alternatively, or additionally, the power receiver clients 103a-103n can direct the wireless devices 102.1-102.n to communicate with the wireless power transmission system via existing data communications modules. In some embodiments the beacon signal, which is primarily referred to herein as a continuous waveform, can alternatively or additionally take the form of a modulated signal.

Figure 2:
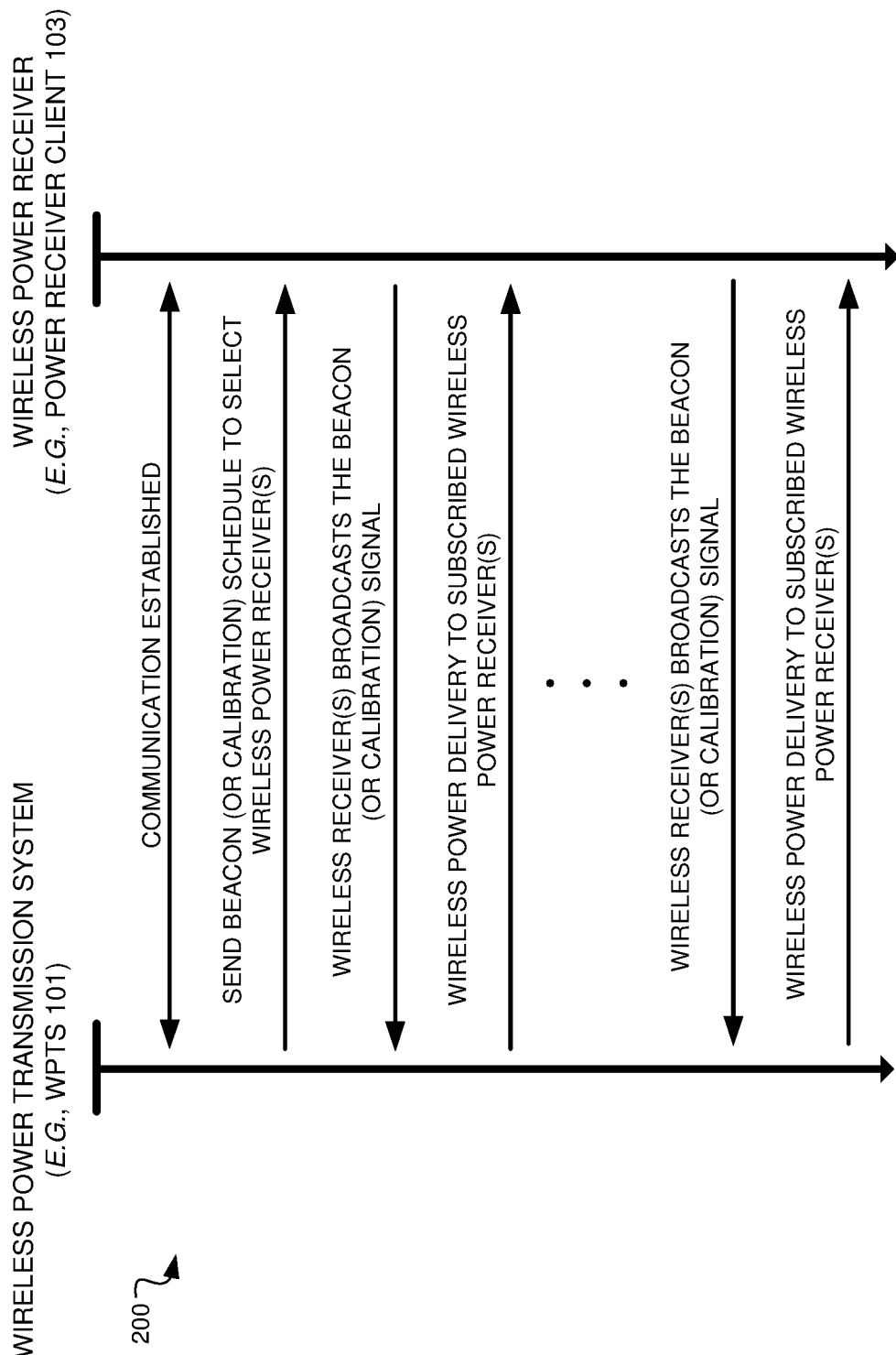
FIG. 2 depicts a sequence diagram illustrating example operations between a wireless power transmission system and a wireless receiver client for commencing wireless power delivery in accordance with some embodiments.

FIG. 2 is a sequence diagram 200 illustrating example operations between a wireless power delivery system (e.g., WPTS 101) and a wireless power receiver client (e.g., wireless power receiver client 103) for establishing wireless power delivery in a multipath wireless power delivery, according to an embodiment. Initially, communication is established between the wireless power transmission system 101 and the power receiver client 103. The initial communication can be, for example, a data communication link that is established via one or more antennas 104 of the wireless power transmission system 101. As discussed, in some embodiments, one or more of the antennas 104a-104n can be data antennas, wireless power transmission antennas, or dual-purpose data/power antennas. Various information can be exchanged between the wireless power transmission system 101 and the wireless power receiver client 103 over this data communication channel. For example, wireless power signaling can be time sliced among various clients in a wireless power delivery environment. In such cases, the wireless power transmission system 101 can send beacon schedule information, e.g., Beacon Beat Schedule (BBS) cycle, power cycle information, etc., so that the wireless power receiver client 103 knows when to transmit (broadcast) its beacon signals and when to listen for power, etc.

Continuing with the example of FIG. 2, the wireless power transmission system 101 selects one or more wireless power receiver clients for receiving power and sends the beacon schedule information to the select power receiver clients 103. The wireless power transmission system 101 can also send power transmission scheduling information so that the power receiver client 103 knows when to expect (e.g., a window of time) wireless power from the wireless power transmission system. The power receiver client 103 then generates a beacon (or calibration) signal and broadcasts the beacon during an assigned beacon transmission window (or time slice) indicated by the beacon schedule information, e.g., Beacon Beat Schedule (BBS) cycle. As discussed herein, the wireless power receiver client 103 include one or more antennas (or transceivers) which have a radiation and reception pattern in three-dimensional space proximate to the wireless device 102 in which the power receiver client 103 is embedded.

The wireless power transmission system 101 receives the beacon from the power receiver client 103 and detects and/or otherwise measures the phase (or direction) from which the beacon signal is received at multiple antennas. The wireless power transmission system 101 then delivers wireless power to the power receiver client 103 from the multiple antennas 103 based on the detected or measured phase (or direction) of the received beacon at each of the corresponding antennas. In some embodiments, the wireless power transmission system 101 determines the complex conjugate of the measured phase of the beacon and uses the complex conjugate to determine a transmit phase that configures the antennas for delivering and/or otherwise directing wireless power to the power receiver client 103 via the same path over which the beacon signal was received from the power receiver client 103.

In some embodiments, the wireless power transmission system 101 includes many antennas; one or more of which are used to deliver power to the power receiver client 103. The wireless power transmission system 101 can detect and/or otherwise determine or measure phases at which the beacon signals are received at each antenna. The large number of antennas may result in different phases of the beacon signal being received at each antenna of the wireless power transmission system 101. As discussed above, the wireless power transmission system 101 can determine the complex conjugate of the beacon signals received at each antenna. Using the complex conjugates, one or more antennas may emit a signal that takes into account the effects of the large number of antennas in the wireless power transmission system 101. In other words, the wireless power transmission system 101 can emit a wireless power transmission signal from the one or more antennas in such a way as to create an aggregate signal from the one or more of the antennas that approximately recreates the waveform of the beacon in the opposite direction. Said another way, the wireless power transmission system 101 can deliver wireless RF power to the client device via the same paths over which the beacon signal is received at the wireless power transmission system 101. These paths can utilize reflective objects 106 within the environment. Additionally, the wireless power transmission signals can be simultaneously transmitted from the wireless power transmission system 101 such that the wireless power transmission signals collectively match the antenna radiation and reception pattern of the client device in a three-dimensional (3D) space proximate to the client device.

As shown, the beacon (or calibration) signals can be periodically transmitted by power receiver clients 103 within the power delivery environment according to, for example, the BBS, so that the wireless power transmission system 101 can maintain knowledge and/or otherwise track the location of the power receiver clients 103 in the wireless power delivery environment. The process of receiving beacon signals from a wireless power receiver client at the wireless power transmission system and, in turn, responding with wireless power directed to that particular client is referred to herein as retrodirective wireless power delivery.

Furthermore, as discussed herein, wireless power can be delivered in power cycles defined by power schedule information. A more detailed example of the signaling required to commence wireless power delivery is described now with reference to FIG. 3.

Figure 3:
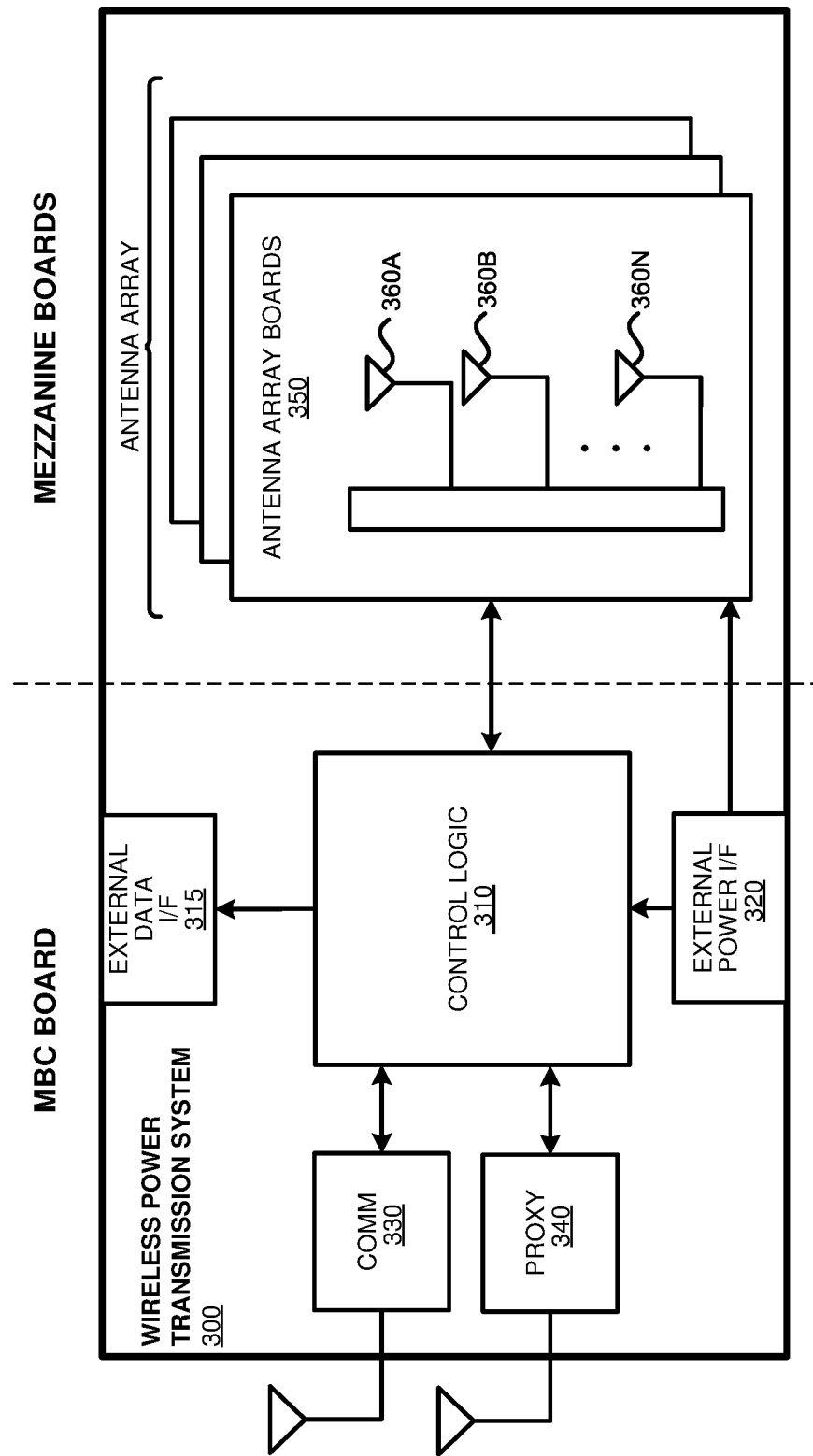
FIG. 3 depicts a block diagram illustrating example components of a wireless power transmission system in accordance with some embodiments.

FIG. 3 is a block diagram illustrating example components of a wireless power transmission system 300, in accordance with an embodiment. As illustrated in the example of FIG. 3, the wireless charger 300 includes a master bus controller (MBC) board and multiple mezzanine boards that collectively comprise the antenna array. The MBC includes control logic 310, an external data interface (I/F) 315, an external power interface (I/F) 320, a communication block 330 and proxy 340. The mezzanine (or antenna array boards 350) each include multiple antennas 360a-360n. Some or all of the components can be omitted in some embodiments. Additional components are also possible. For example, in some embodiments only one of communication block 330 or proxy 340 may be included.

The control logic 310 is configured to provide control and intelligence to the array components. The control logic 310 may comprise one or more processors, FPGAs, memory units, etc., and direct and control the various data and power communications. The communication block 330 can direct data communications on a data carrier frequency, such as the base signal clock for clock synchronization. The data communications can be Bluetooth™, Wi-Fi™, ZigBee™, etc., including combinations or variations thereof. Likewise, the proxy 340 can communicate with clients via data communications as discussed herein. The data communications can be, by way of example and not limitation, Bluetooth™, Wi-Fi™, ZigBee™, etc. Other communication protocols are possible.

In some embodiments, the control logic 310 can also facilitate and/or otherwise enable data aggregation for Internet of Things (IoT) devices. In some embodiments, wireless power receiver clients can access, track and/or otherwise obtain IoT information about the device in which the wireless power receiver client is embedded and provide that IoT information to the wireless power transmission system 300 over a data connection. This IoT information can be provided to via an external data interface 315 to a central or cloud-based system (not shown) where the data can be aggregated, processed, etc. For example, the central system can process the data to identify various trends across geographies, wireless power transmission systems, environments, devices, etc. In some embodiments, the aggregated data and or the trend data can be used to improve operation of the devices via remote updates, etc. Alternatively, or additionally, in some embodiments, the aggregated data can be provided to third party data consumers. In this manner, the wireless power transmission system acts as a Gateway or Enabler for the IoTs. By way of example and not limitation, the IoT information can include capabilities of the device in which the wireless power receiver client is embedded, usage information of the device, power levels of the device, information obtained by the device or the wireless power receiver client itself, e.g., via sensors, etc.

The external power interface 320 is configured to receive external power and provide the power to various components. In some embodiments, the external power interface 320 may be configured to receive a standard external 24 Volt power supply. In other embodiments, the external power interface 320 can be, for example, 120/240 Volt AC mains to an embedded DC power supply which sources the required 12/24/48 Volt DC to provide the power to various components. Alternatively, the external power interface could be a DC supply which sources the required 12/24/48 Volts DC. Alternative configurations are also possible.

In operation, the master bus controller (MBC), which controls the wireless power transmission system 300, receives power from a power source and is activated. The MBC then activates the proxy antenna elements on the wireless power transmission system and the proxy antenna elements enter a default "discovery" mode to identify available wireless receiver clients within range of the wireless power transmission system. When a client is found, the antenna elements on the wireless power transmission system power on, enumerate, and (optionally) calibrate.

The MBC then generates beacon transmission scheduling information and power transmission scheduling information during a scheduling process. The scheduling process includes selection of power receiver clients. For example, the MBC can select power receiver clients for power transmission and generate a Beacon Beat Schedule (BBS) cycle and a Power Schedule (PS) for the selected wireless power receiver clients. As discussed herein, the power receiver clients can be selected based on their corresponding properties and/or requirements.

In some embodiments, the MBC can also identify and/or otherwise select available clients that will have their status queried in the Client Query Table (CQT). Clients that are placed in the CQT are those on "standby", e.g., not receiving a charge. The BBS and PS are calculated based on vital information about the clients such as, for example, battery status, current activity/usage, how much longer the client has until it runs out of power, priority in terms of usage, etc.

The Proxy AE broadcasts the BBS to all clients. As discussed herein, the BBS indicates when each client should send a beacon. Likewise, the PS indicates when and to which clients the array should send power to and when clients should listen for wireless power. Each client starts broadcasting its beacon and receiving power from the array per the BBS and PS. The Proxy can concurrently query the Client Query Table to check the status of other available clients. In some embodiments, a client can only exist in the BBS or the CQT (e.g., waitlist), but not in both. The information collected in the previous step continuously and/or periodically updates the BBS cycle and/or the PS.

Figure 4:
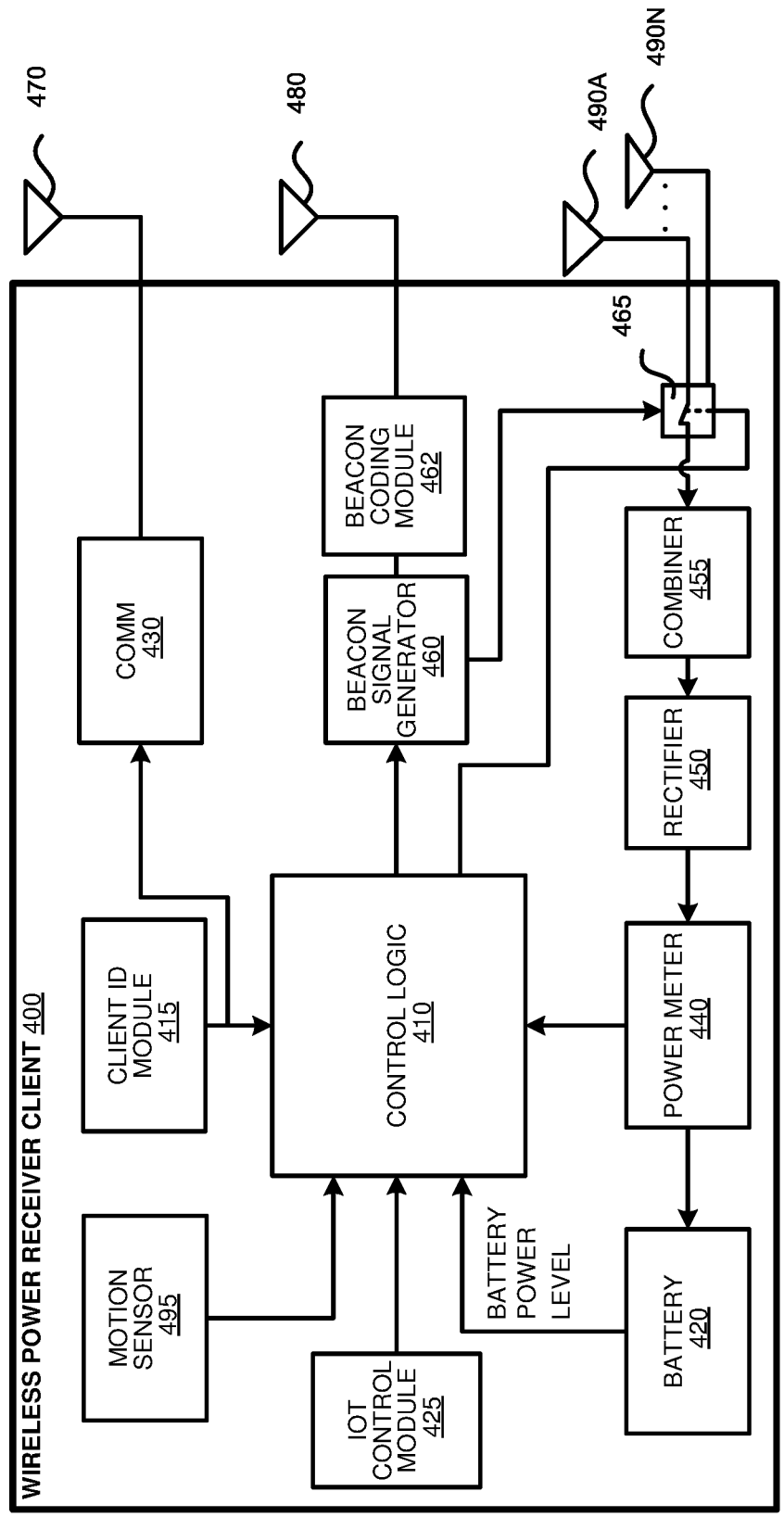
FIG. 4 depicts a block diagram illustrating example components of a wireless power receiver client in accordance with some embodiments.

FIG. 4 is a block diagram illustrating example components of a wireless power receiver client, in accordance with some embodiments. As illustrated in the example of FIG. 4, the receiver 400 includes control logic 410, battery 420, an IoT control module 425, communication block 430 and associated antenna 470, power meter 440, rectifier 450, a combiner 455, beacon signal generator 460, beacon coding unit 462 and an associated antenna 480, and switch 465 connecting the rectifier 450 or the beacon signal generator 460 to one or more associated antennas 490*a-n*. Some or all of the components can be omitted in some embodiments. For example, in some embodiments, the wireless power receiver client does not include its own antennas but instead utilizes and/or otherwise shares one or more antennas (e.g., Wi-Fi antenna) of the wireless device in which the wireless power receiver client is embedded. Moreover, in some embodiments, the wireless power receiver client may include a single antenna that provides data transmission functionality as well as power/data reception functionality. Additional components are also possible.

A combiner 455 receives and combines the received power transmission signals from the power transmitter in the event that the receiver 400 has more than one antenna. The combiner can be any combiner or divider circuit that is configured to achieve isolation between the output ports while maintaining a matched condition. For example, the combiner 455 can be a Wilkinson Power Divider circuit. The rectifier 450 receives the combined power transmission signal from the combiner 455, if present, which is fed through the power meter 440 to the battery 420 for charging. In other embodiments, each antenna's power path can have its own rectifier 450 and the DC power out of the rectifiers is combined prior to feeding the power meter 440. The power meter 440 can measure the received power signal strength and provides the control logic 410 with this measurement.

Battery 420 can include protection circuitry and/or monitoring functions. Additionally, the battery 420 can include one or more features, including, but not limited to, current limiting, temperature protection, over/under voltage alerts and protection, and coulomb monitoring.

The control logic 410 can receive the battery power level from the battery 420 itself. The control logic 410 may also transmit/receive via the communication block 430 a data signal on a data carrier frequency, such as the base signal clock for clock synchronization. The beacon signal generator 460 generates the beacon signal, or calibration signal, transmits the beacon signal using either the antenna 480 or 490 after the beacon signal is encoded.

It may be noted that, although the battery 420 is shown as charged by, and providing power to, the receiver 400, the receiver may also receive its power directly from the rectifier 450. This may be in addition to the rectifier 450 providing charging current to the battery 420, or in lieu of providing charging. Also, it may be noted that the use of multiple antennas is one example of implementation and the structure may be reduced to one shared antenna.

In some embodiments, the control logic 410 and/or the IoT control module 425 can communicate with and/or otherwise derive IoT information from the device in which the wireless power receiver client 400 is embedded. Although not shown, in some embodiments, the wireless power receiver client 400 can have one or more data connections (wired or wireless) with the device in which the wireless power receiver client 400 is embedded over which IoT information can be obtained. Alternatively, or additionally, IoT information can be determined and/or inferred by the wireless power receiver client 400, e.g., via one or more sensors. As discussed above, the IoT information can include, but is not limited to, information about the capabilities of the device in which the wireless power receiver client is embedded, usage information of the device in which the wireless power receiver client is embedded, power levels of the battery or batteries of the device in which the wireless power receiver client is embedded, and/or information obtained or inferred by the device in which the wireless power receiver client is embedded or the wireless power receiver client itself, e.g., via sensors, etc.

In some embodiments, a client identifier (ID) module 415 stores a client ID that can uniquely identify the power receiver client in a wireless power delivery environment. For example, the ID can be transmitted to one or more wireless power transmission systems when communication is established. In some embodiments, power receiver clients may also be able to receive and identify other power receiver clients in a wireless power delivery environment based on the client ID.

An optional motion sensor 495 can detect motion and signal the control logic 410 to act accordingly. For example, a device receiving power may integrate motion detection mechanisms such as accelerometers or equivalent mechanisms to detect motion. Once the device detects that it is in motion, it may be assumed that it is being handled by a user, and would trigger a signal to the array to either to stop transmitting power, or to lower the power transmitted to the device. In some embodiments, when a device is used in a moving environment like a car, train or plane, the power might only be transmitted intermittently or at a reduced level unless the device is critically low on power.

Figure 5A:
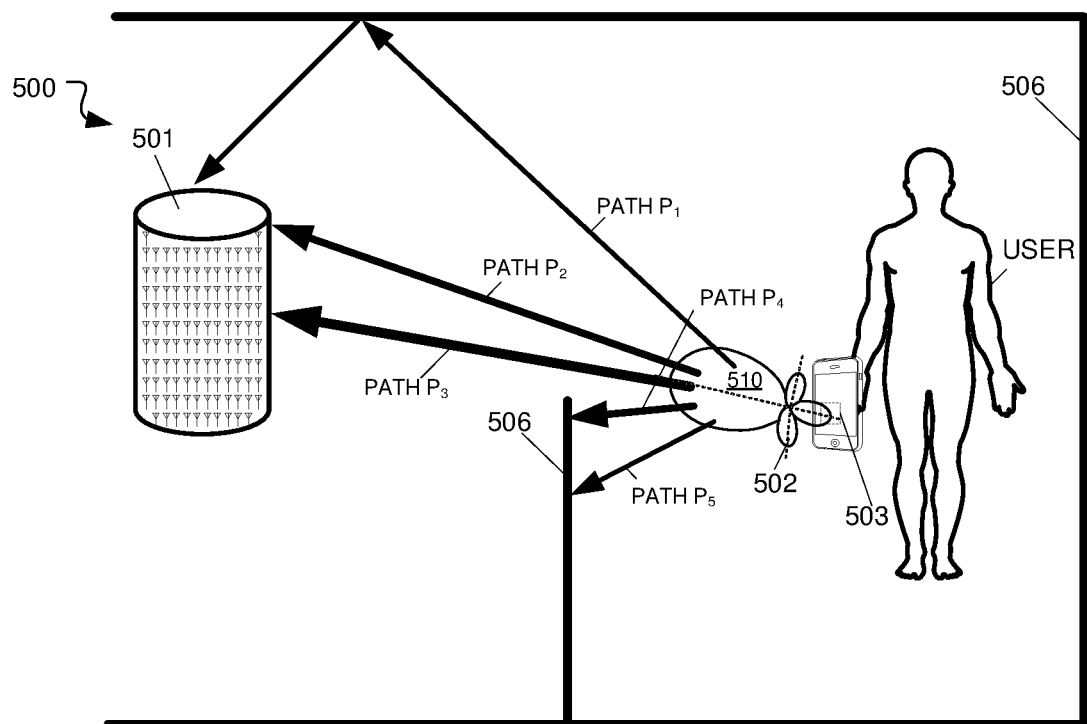
FIGS. 5A and 5B depict diagrams illustrating an example multipath wireless power delivery environment in accordance with some embodiments.
Figure 5B:
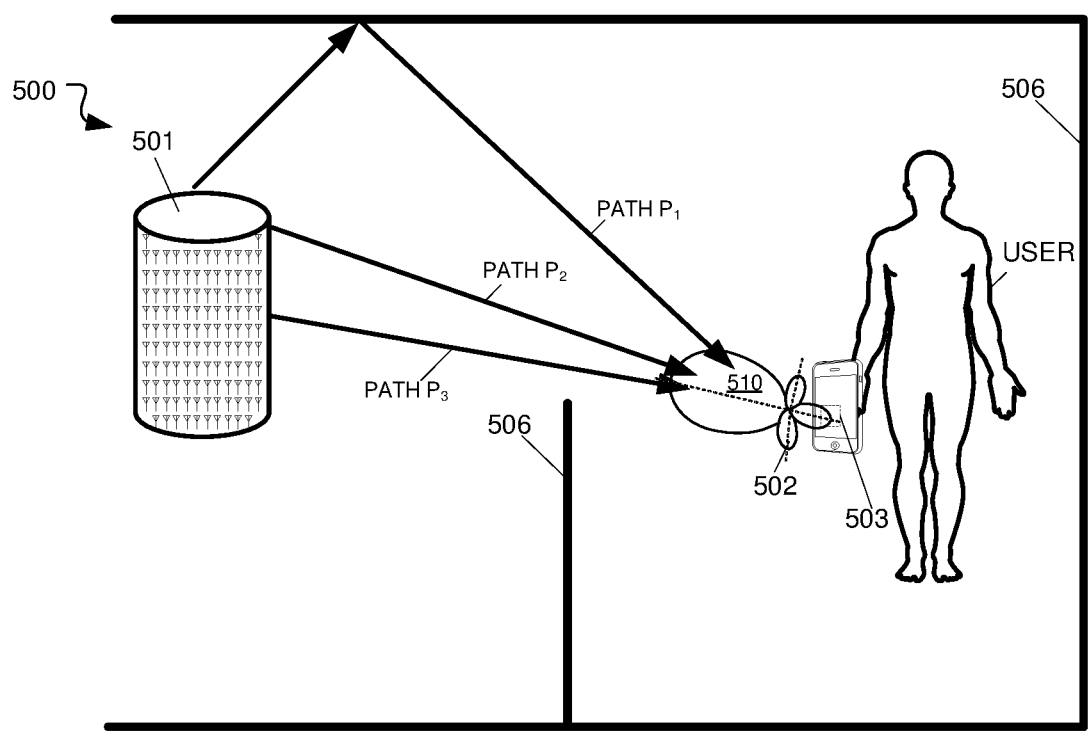

FIGS. 5A and 5B depict diagrams illustrating an example multipath wireless power delivery environment 500, according to some embodiments. The multipath wireless power delivery environment 500 includes a user operating a wireless device 502 including one or more wireless power receiver clients 503. The wireless device 502 and the one or more wireless power receiver clients 503 can be wireless device 102 of FIG. 1 and wireless power receiver client 103 of FIG. 1 or wireless power receiver client 400 of FIG. 4, respectively, although alternative configurations are possible. Likewise, wireless power transmission system 501 can be wireless power transmission system 101 FIG. 1 or wireless power transmission system 300 of FIG. 3, although alternative configurations are possible. The multipath wireless power delivery environment 500 includes reflective objects 506 and various absorptive objects, e.g., users, or humans, furniture, etc.

Wireless device 502 includes one or more antennas (or transceivers) that have a radiation and reception pattern 510 in three-dimensional space proximate to the wireless device 102. The one or more antennas (or transceivers) can be wholly or partially included as part of the wireless device 102 and/or the wireless power receiver client (not shown). For example, in some embodiments one or more antennas, e.g., Wi-Fi, Bluetooth, etc. of the wireless device 502 can be utilized and/or otherwise shared for wireless power reception. As shown in the example of FIGS. 5A and 5B, the radiation and reception pattern 510 comprises a lobe pattern with a primary lobe and multiple side lobes. Other patterns are also possible.

The wireless device 502 transmits a beacon (or calibration) signal over multiple paths to the wireless power transmission system 501. As discussed herein, the wireless device 502 transmits the beacon in the direction of the radiation and reception pattern 510 such that the strength of the received beacon signal by the wireless power transmission system, e.g., RSSI, depends on the radiation and reception pattern 510. For example, beacon signals are not transmitted where there are nulls in the radiation and reception pattern 510 and beacon signals are the strongest at the peaks in the radiation and reception pattern 510, e.g., peak of the primary lobe. As shown in the example of FIG. 5A, the wireless device 502 transmits beacon signals over five paths P1-P3. Paths P4 and P5 are blocked by reflective and/or absorptive object 506. The wireless power transmission system 501 receives beacon signals of increasing strengths via paths P1-P3. The bolder lines indicate stronger signals. In some embodiments the beacon signals are directionally transmitted in this manner to, for example, avoid unnecessary RF energy exposure to the user.

A fundamental property of antennas is that the receiving pattern (sensitivity as a function of direction) of an antenna when used for receiving is identical to the far-field radiation pattern of the antenna when used for transmitting. This is a consequence of the reciprocity theorem in electromagnetics. As shown in the example of FIGS. 5A and 5B, the radiation and reception pattern 510 is a three-dimensional lobe shape. However, the radiation and reception pattern 510 can be any number of shapes depending on the type or types, e.g., horn antennas, simple vertical antenna, etc. used in the antenna design. For example, the radiation and reception pattern 510 can comprise various directive patterns. Any number of different antenna radiation and reception patterns are possible for each of multiple client devices in a wireless power delivery environment.

Referring again to FIG. 5A, the wireless power transmission system 501 receives the beacon (or calibration) signal via multiple paths P1-P3 at multiple antennas or transceivers. As shown, paths P2 and P3 are direct line of sight paths while path P1 is a non-line of sight path. Once the beacon (or calibration) signal is received by the wireless power transmission system 501, the power transmission system 501 processes the beacon (or calibration) signal to determine one or more receive characteristics of the beacon signal at each of the multiple antennas. For example, among other operations, the wireless power transmission system 501 can measure the phases at which the beacon signal is received at each of the multiple antennas or transceivers.

The wireless power transmission system 501 processes the one or more receive characteristics of the beacon signal at each of the multiple antennas to determine or measure one or more wireless power transmit characteristics for each of the multiple RF transceivers based on the one or more receive characteristics of the beacon (or calibration) signal as measured at the corresponding antenna or transceiver. By way of example and not limitation, the wireless power transmit characteristics can include phase settings for each antenna or transceiver, transmission power settings, etc.

As discussed herein, the wireless power transmission system 501 determines the wireless power transmit characteristics such that, once the antennas or transceivers are configured, the multiple antennas or transceivers are operable to transit a wireless power signal that matches the client radiation and reception pattern in the three-dimensional space proximate to the client device. FIG. 5B illustrates the wireless power transmission system 501 transmitting wireless power via paths P1-P3 to the wireless device 502. Advantageously, as discussed herein, the wireless power signal matches the client radiation and reception pattern 510 in the three-dimensional space proximate to the client device. Said another way, the wireless power transmission system will transmit the wireless power signals in the direction in which the wireless power receiver has maximum gain, e.g., will receive the most wireless power. As a result, no signals are sent in directions in which the wireless power receiver cannot receiver, e.g., nulls and blockages. In some embodiments, the wireless power transmission system 501 measures the RSSI of the received beacon signal and if the beacon is less than a threshold value, the wireless power transmission system will not send wireless power over that path.

The three paths shown in the example of FIGS. 5A and 5B are illustrated for simplicity, it is appreciated that any number of paths can be utilized for transmitting power to the wireless device 502 depending on, among other factors, reflective and absorptive objects in the wireless power delivery environment.

In retrodirective wireless power delivery environments, wireless power receivers generate and send beacon (or calibration) signals that are received by an array of antennas of a wireless power transmission system. The beacon signals provide the charger with timing information for wireless power transfers, and also indicate directionality of the incoming signal. As discussed herein, this directionality information is employed when transmitting in order to focus energy (e.g., power wave delivery) on individual wireless power receiver clients. Additionally, directionality facilitates other applications such as, for example, tracking device movement.

In some embodiments, wireless power receiver clients in a wireless power delivery environment are tracked by a wireless power transmission system using a three dimensional angle of incidence of an RF signal (at any polarity) paired with a distance determined by using an RF signal strength or any other method. As discussed herein, an array of antennas capable of measuring phase (e.g., the wireless power transmission system array) can be used to detect a wavefront angle of incidence. A distance to the wireless power receiver client can be determined based on the angle from multiple array segments. Alternatively, or additionally, the distance to the wireless power receiver client can be determined based on power calculations.

In some embodiments, the degree of accuracy in determining the angle of incidence of an RF signal depends on a size of the array of antennas, a number of antennas, a number of phase steps, method of phase detection, accuracy of distance measurement method, RF noise level in environment, etc. In some embodiments, users may be asked to agree to a privacy policy defined by an administrator for tracking their location and movements within the environment. Furthermore, in some embodiments, the system can use the location information to modify the flow of information between devices and optimize the environment. Additionally, the system can track historical wireless device location information and develop movement pattern information, profile information, and preference information.

Figure 6:
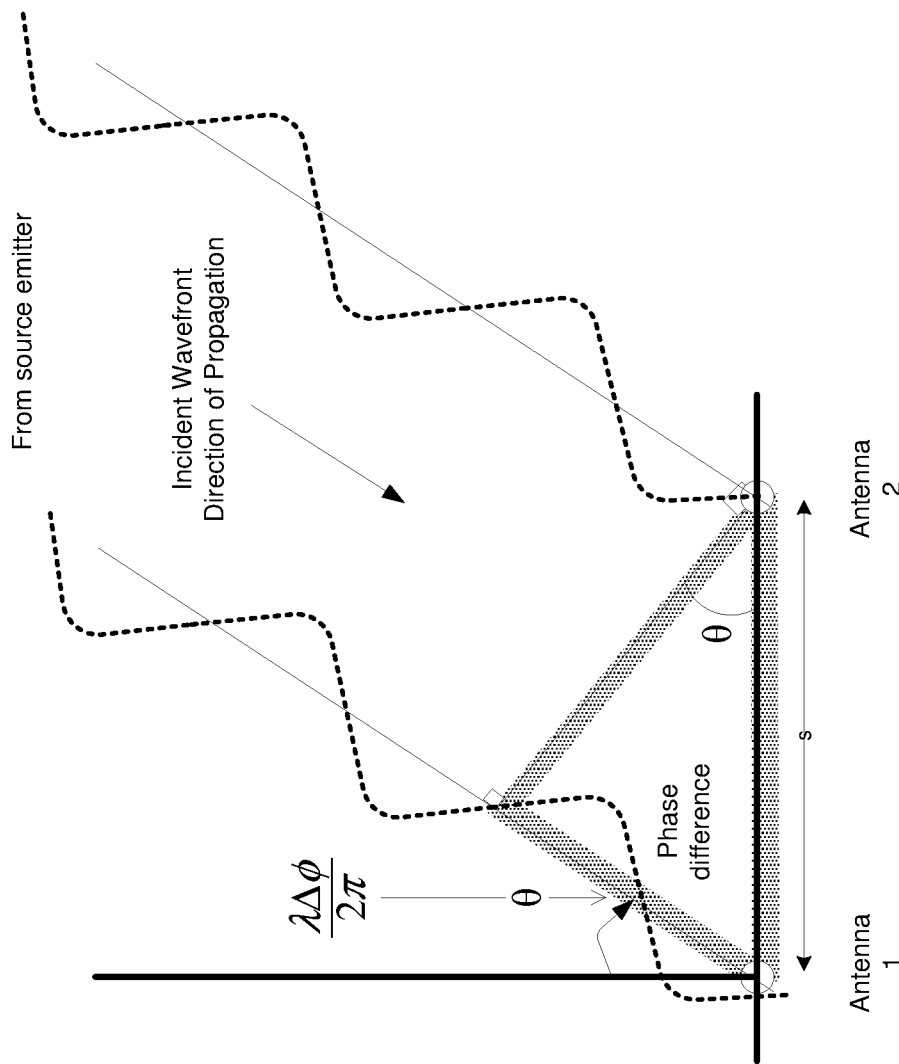
FIG. 6 is a diagram illustrating an example determination of an incident angle of a wavefront in accordance with some embodiments.

FIG. 6 is a diagram illustrating an example determination of an incident angle of a wavefront, according to some embodiments. By way of example and not limitation, the incident angle of a wavefront can be determined using an array of transducers based on, for example, the received phase measurements of four antennas for omnidirectional detection, or three antennas can be used for detecting the wavefront angle on one hemisphere. In these examples, the transmitting device (i.e., the wireless device) is assumed to be on a line coming from the center of the three or more antennas out to infinity. If the at least three different antennas are located a sufficient known distance away and are also used to determine incident wave angle, then the convergence of the two lines plotted from the phase-detecting antennas is the location of the device. In the example of FIG. 6, $$\theta = \sin^{-1}\left(\frac{\lambda\Delta\phi}{2\pi s}\right),$$

where $\lambda$ is the wavelength of the transmitted signal, and $\Delta\phi$ is the phase offset in radians and s is the inter-element spacing of the receiving antennas.

If less than one wavelength of antennas spacing is used between two antennas, an unambiguous two-dimensional (2D) wavefront angle can be determined for a hemisphere. If three antennas are used, an unambiguous three-dimensional (3D) angle can be determined for a hemisphere. In some embodiments, if a specified number of antennas, e.g., four antennas are used, an unambiguous 3D angle can be determined for a sphere. For example, in one implementation, 0.25 to 0.75 wavelength spacing between antennas can be used. However, other antenna spacing and parameters may be used. The antennas described above are omnidirectional antennas which each cover all polarities. In some embodiments, in order to provide omnidirectional coverage at every polarity, more antennas may be needed depending on the antenna type/shape/orientation.

Figure 7:
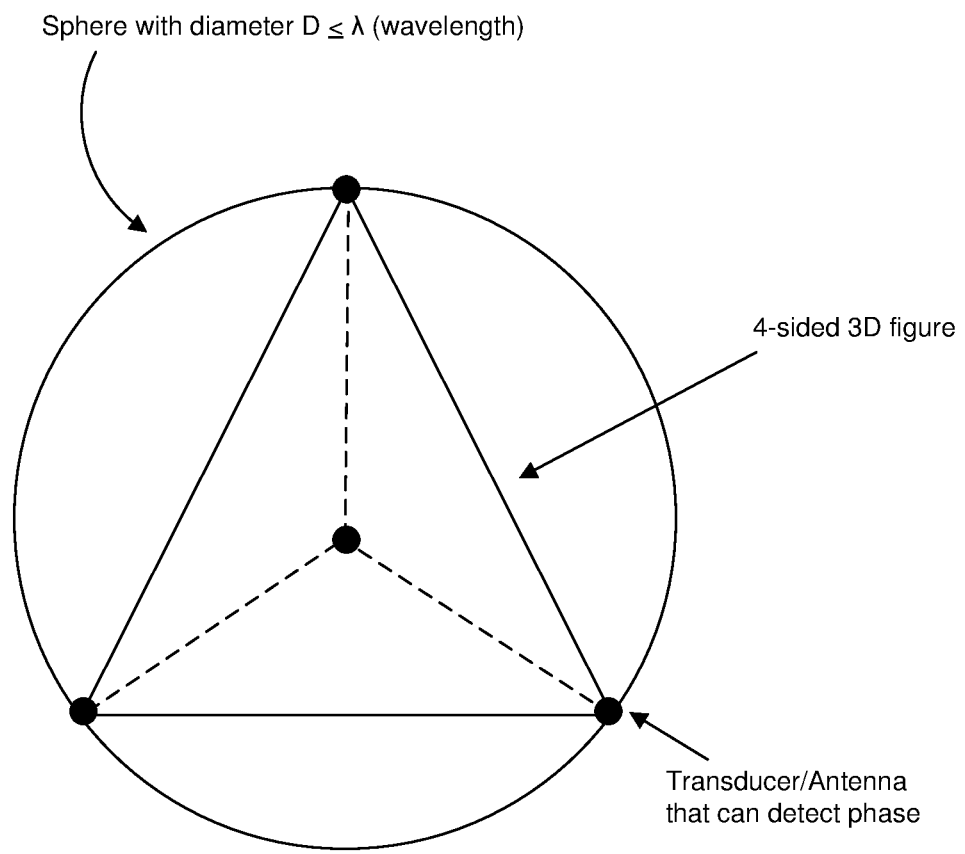
FIG. 7 is a diagram illustrating an example minimum omnidirectional wavefront angle detector in accordance with some embodiments.

FIG. 7 is a diagram illustrating an example minimum omnidirectional wavefront angle detector, according to some embodiments. As discussed above, the distance to the transmitter can be calculated based on received power compared to a known power (e.g., the power used to transmit), or utilizing other distance determination techniques. The distance to the transmitting device can be combined with an angle determined from the above-described process to determine device location. In addition, or alternatively, the distance to the transmitter can be measured by any other means, including measuring the difference in signal strength between sent and received signals, sonar, timing of signals, etc.

When determining angles of incidence, a number of calculations must be performed in order to determine receiver directionality. The receiver directionality (e.g., the direction from which the beacon signal is received) can comprise a phase of the signal as measured at each of multiple antennas of an array. In an array with multiple hundreds, or even thousands, or antenna elements, these calculations may become burdensome or take longer to compute than desirable. In order to address reduce the burden of sampling a single beacon across multiple antenna elements and determining directionality of the wave, a method is proposed that leverages previously calculated values to simplify some receiver sampling events.

Additionally, in some cases it is extremely beneficial to determine if a receiver within the charging environment, or some other element of the environment, is moving or otherwise transitory. Thus, rather than the above attempt to determine actual or exact location, the utilization of precalculated values may be employed to identify object movement within the environment. Each antenna unit automatically and autonomously calculates the phase of the incoming beacon. The Antennas (or a representative subset of antennas) then report the detected (or measured phases up to the master controller for analysis). To detect movement, the master controller monitors the detected phases over time, looking for a variance to sample for each antenna.

II. Signal Phase Determinations

As discussed above, in retrodirective wireless power delivery environments, wireless power receivers generate and send beacon signals that are received by an array of antennas of a wireless power transmission system. The beacon signals provide the charger with timing information for wireless power transfers, and also indicate directionality of the incoming signal. As discussed herein, this directionality information is employed when transmitting in order to focus energy (e.g., power wave delivery) on individual wireless power receiver clients.

Due to varying path lengths in a multipath environment and the different number and/or types of reflections in a given path, signals may be received over each path of the multiple paths at any phase. Accordingly, to constructively sum the arriving signals, the phases of the signals are first aligned.

In some embodiments, multiple sub-systems with different directional or polarization properties may be coupled using a system of phase shifters so that greater directivity may be achieved. In this scenario, the phase shifting arrays may be defined in a number of ways. For example, the phase shifting arrays can be defined as a microwave integrated circuit such as a switchable length of transmission line, as ferrite based phase shifters where the performance is a function of applied field, or through any other circuit providing control of the reference signal phase, including combinations or variations thereof. Although relatively slow to switch (e.g., on the order of tens of milliseconds for conventional ferrite structures), these phase shifting arrays have been the dominant phase shift technology for many years. However, more recently, Ferro-electric capacitors made of Barium Strontium Titanate have increased in popularity due to faster response times and the ability to perform in broadband applications. In some implementations, microelectromechanical system (MEMS) switches are used to select phase taps on a transmission line.

In some embodiments, an integration of the phase shifting systems may be used to reduce system cost. Moreover, as discussed herein, the phase shifting systems may be used as part of the receiving system so as to determine the phase shift offsets for a receiving antenna array. The summation of phase shifted signals from the antennas in an array provide a directional setting for the array when power is to be broadcast to the remote power-receiving appliances.

Figure 8:
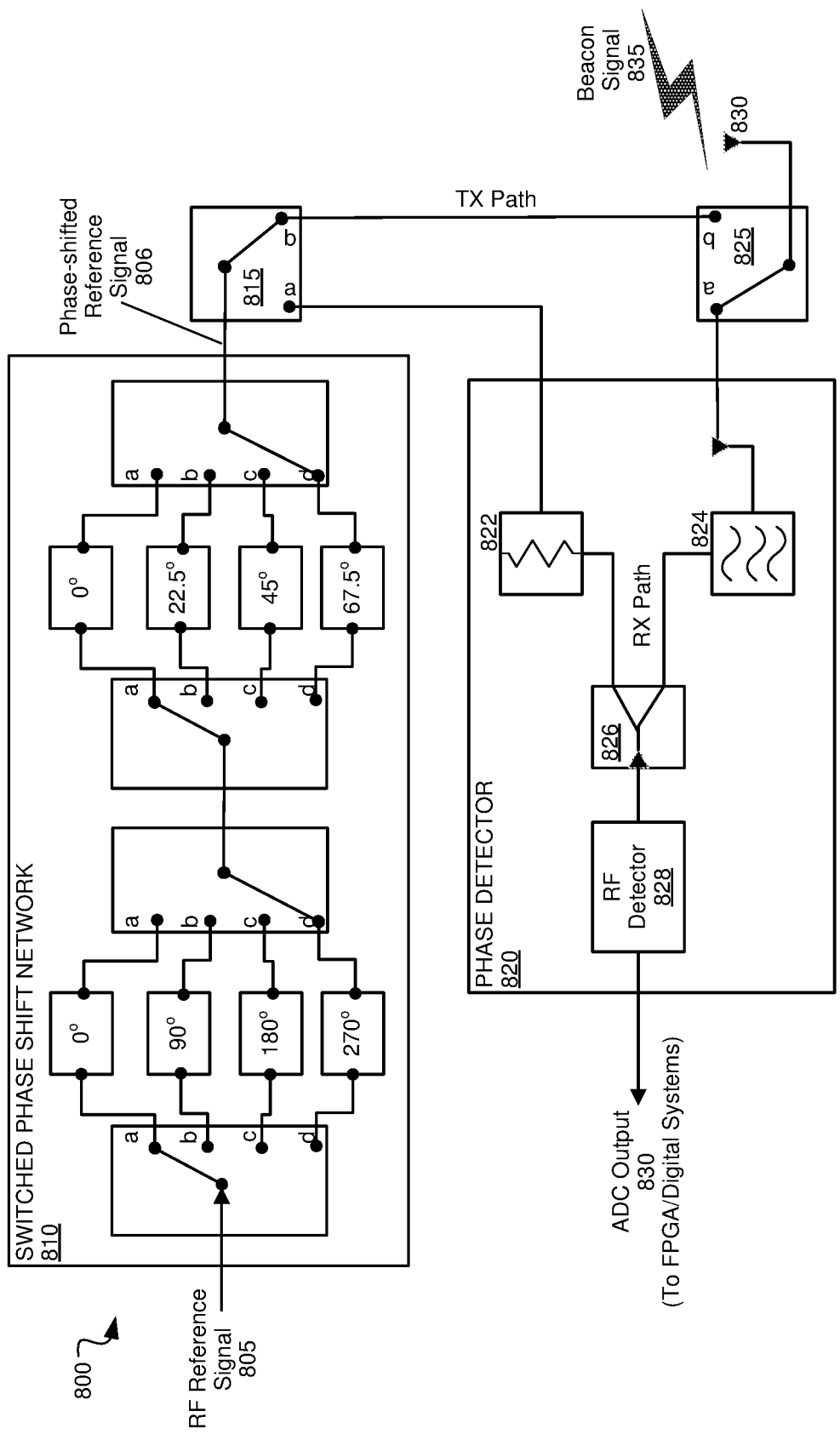
FIG. 8 illustrates an example phase detection circuit in accordance with some embodiments.

FIG. 8 illustrates an example phase detection circuit 800, according to some embodiments. More specifically, the example phase detection circuit 800 is capable of rapidly determining the phase of an incoming signal utilizing a switched transmission line phase shifter. In some embodiments, an instance of the example phase detection circuit architecture 800 can be included for each antenna in the system. Each instance can be centrally coordinated and controlled by digital support systems.

The example phase detection circuit 800 includes a shifted switched phase shift network 810, a phase detector 820, and transmit/receive (TX/RX) switches 815 and 825. A reference signal 805 of a known frequency and set phase is provided to the switched phase shift network 810. Typically, the reference frequency of the reference signal is approximately equal to that of a beacon signal that is being sampled by the phase detection system.

As shown in the example of FIG. 8, the switched phase shifter network 810 is comprised of two stages of switched transmission lines, allowing a 360° phase shift range in 22.5° step sizes. The phase shift network 810 rapidly phase shifts, multiple times per detection cycle, the reference signal 805 as the beacon signal 835 remains at a static phase. The resulting signal, e.g., the phase-shifted reference signal 806, is provided to TX/RX switch 815. The TX/RX switches 815 and 825 switches select between a receive (RX) mode and a transmit (TX) mode.

In the receive mode, a beacon signal 835 received from a wireless power receiver client enters antenna 830 and both the beacon signal 835 and the phase-shifted reference signal 806 are directed into the phase detector 820. The phase detector may normalize the phase-shifted reference signal 806 and the beacon signal 835. For example, the phase-shifted reference signal 806 can be significantly stronger than the received beacon signal 835, so, in some instances, it may be necessary to amplify the beacon signal (e.g., at amplifier 824) and/or attenuate the phase-shifted reference signal (e.g., at attenuator 822) until the amplitudes of these signals are roughly aligned. Precise amplitude alignment through Automatic Gain Control (AGC) is not necessary for functionality, but may be used in some implementations.

Next, the normalized signals are combined at combiner 826. Depending on the relative phases of the phase-shifted reference signal and beacon signal, the RF Detector block 828 will output a larger or smaller Direct Current (DC) value, e.g., maximum DC output when the two signals are in phase at the combiner ports, minimum DC output when they are 180° out of phase. The DC outputs can be provided to and/or read and stored by a digital control system (not shown) which may be implemented as a gate array (for example a FPGA) or may be incorporated as part of a control processor subsystem (e.g., control logic 310 of FIG. 3).

In operation, as discussed above, the phase shift network 810 rapidly phase shifts the reference signal 805 (e.g., multiple times per detection cycle) as the beacon signal 835 remains at a static phase. The phase detector 820 outputs DC values from each phase shift. The collected DC values are subsequently used, e.g., by the digital controller to calculate the received phase of the incoming beacon signal 835 relative to the reference signal 805.

Once the phase of the beacon has been determined, along with the appropriate output phase, the phase shifter block 810 can be set to the output value and the TX/RX switches 815 and 825 can be directed to the transmission (TX) path for transmit mode.

Figure 9:
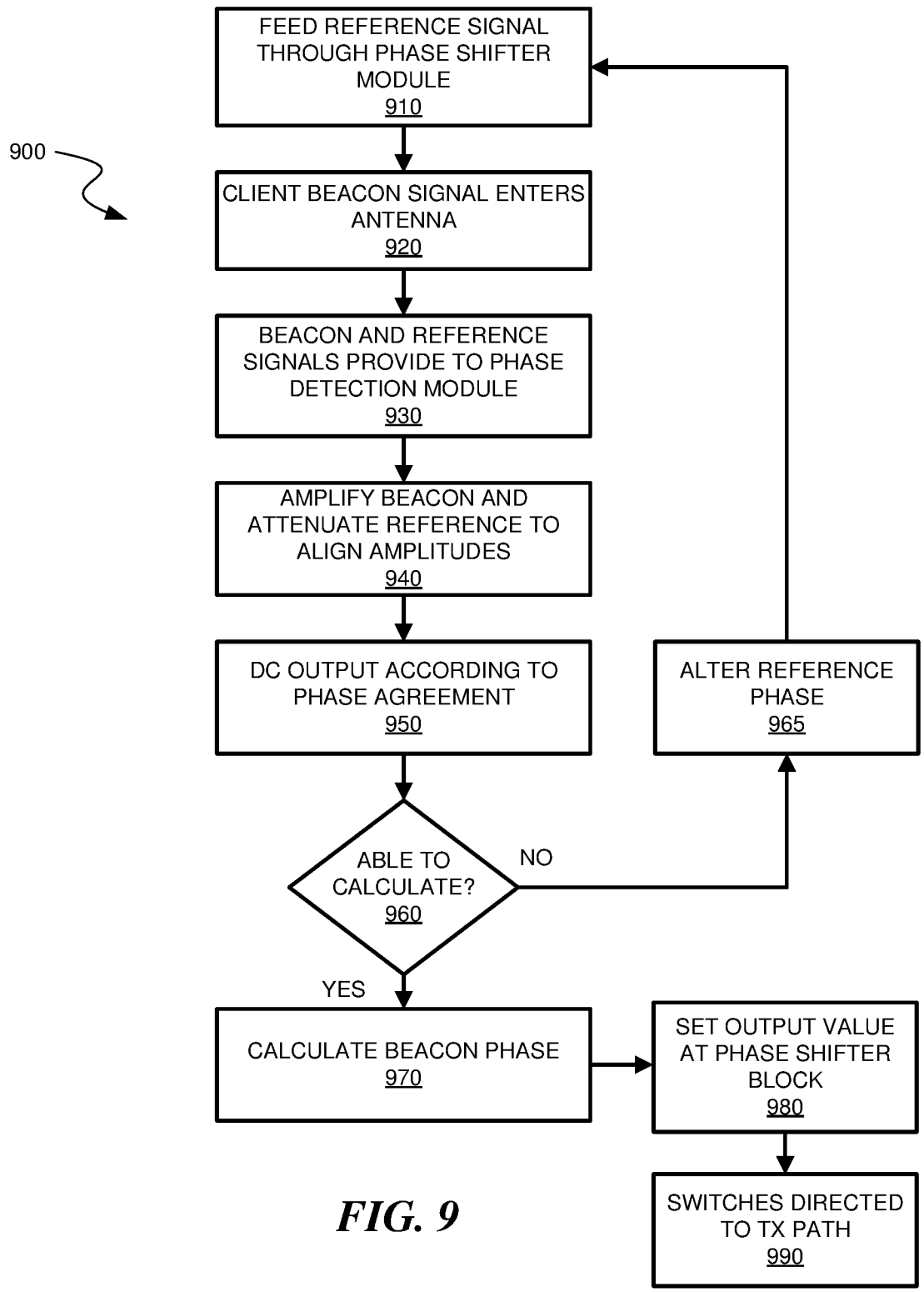
FIG. 9 depicts a flow diagram illustrating an example process for detecting the phase of a received signal in accordance with some embodiments.

FIG. 9 depicts a flow diagram illustrating an example process 900 for detecting the phase of a received signal, according to some embodiments. More specifically, the example process 900 is discussed with reference to detection of the phase of a received beacon signal in a wireless power delivery environment. The operations may be performed by various components of a phase detection apparatus such as, for example, phase detection circuit 800 of FIG. 8.

To begin, at 910, a reference signal is initially fed through a phase shifter module of the phase detection apparatus to modulate the phase. The phase shifter module can be, for example, the switched phase shift network 810 of FIG. 8, although alternative configurations are possible. At 920, a beacon signal transmitted by a client in a wireless power delivery environment is received by an antenna. The antenna can be, for example antenna 830 of FIG. 8, although alternative configurations are possible.

At 930, the received beacon signal and the phase-shifted (or modulated) reference signal are received by a phase detection module of the phase detection apparatus. At 940, the received beacon signal and the phase-shifted (or modulated) reference signal are normalized. For example, the phase-shifted reference signal can be significantly stronger than the received beacon signal. In such instances, it may be necessary to amplify the beacon signal and/or attenuate the phase-shifted reference signal until the amplitudes of these signals are roughly aligned.

At 950, a comparison is made, the result of which is a DC output in proportion to the degree of phase and amplitude alignment between the two signals. Next, at decision 960, a determination is made as to whether there are sufficient samples to be able to determine the phase. If there are insufficient samples to make a phase determination, at 965, the amplitude of the DC voltage at the phase detector output is noted and the phase offset of the reference signal is incremented. The process is repeated until sufficient samples are collected to determine the relative phase of the incoming beacon signal.

Once there is sufficient data to make a phase determination, at 970, the relative beacon phase is calculated. At 980, the phase shifter block is set to the appropriate phase value and, at 990, the switches are set to the TX path.

Rapid Phase Detection: Example 3-Point Phase Detection Algorithm

In the simplest use of the circuit illustrated in FIG. 8, sixteen phase points can be set for the reference signal. During phase detection each of these reference signals at the different phases are compared to the beacon in order to determine the relative phase of the incoming beacon. However, due to physical system limitations such as frequency differences between the charger and client RF signals due to frequency drift and oscillator phase noise, for example, it is necessary to perform phase detections as quickly as possible to minimize error in the measurement. As such, in some embodiments, it may be desirable to implement a 3-point algorithm, thus reducing the phase detection time for the above system by reducing the sample count from 16 to 3, while still maintaining sufficiently accurate phase measurement capabilities.

The 3-point model employed for the detection of phase may be represented as a power equation $P(\theta_1, \theta_2, \ldots)$ a function of the phases $\theta_n$ on each of the n antennas. P is periodic, with period of $2\pi$ for each of the phases $\theta_n$. Further, the contribution of the total power P of each antenna is small. The dependence of the power on any particular phase is substantially sinusoidal. Thus, the received power may be approximated as follows: $P(\theta_1, \theta_2, \ldots) \approx A + B\cos(\theta_k) + C\sin(\theta_k))$ where the phases of each antenna except for $\theta_{m \neq k}$ are held constant.

Thus, for the 3-point model, it is possible to make three power vs. phase measurements to determine the constants A, B and C. Choosing any three values of $\theta_k, \theta_{1,2,3}$ results in the following matrix:

$$\begin{bmatrix} P_{k1} \\ P_{k2} \\ P_{k3} \end{bmatrix} = \begin{bmatrix} 1 & \cos(\theta_1) & \sin(\theta_1) \\ 1 & \cos(\theta_2) & \sin(\theta_2) \\ 1 & \cos(\theta_3) & \sin(\theta_3) \end{bmatrix} \begin{bmatrix} A \\ B \\ C \end{bmatrix}.$$

For the particular choice $$\emptyset_m = \left(0, \frac{\pi/2, 5\pi}{4}\right),$$

the matrix is nonsingular and has maximum determinant of $(1+\sqrt{2})$. This yields a robust inverse and, as such, the parameters A, B and C may be found by a simple matrix inversion, resulting in $\hat{\theta}_k = \arctan_2(C, B)$.

The optimal power can thus be estimated as: $P_k(\hat{\theta}_k) \approx A + \sqrt{B^2+C^2}$. The resulting $\hat{\theta}$ can be calculated to whatever degree of precision that is desired by simply varying the number of antennas used to take measurements. As the number of antennas increases, the accuracy of the above model increases for sensing phase.

III. Detection of Client and Object Movement

As previously touched upon, the ability to sense movement within a wireless charging environment may be particularly beneficial in determining the frequency that a client is required to beacon. Beacon transmissions cost precious power, and are periods of time where the client is unable to receive power transmissions. As such, relatively infrequent beacon events may help increase wireless charging efficiency in a relatively static environment. However, as the environment becomes more dynamic, the need for beaconing increases in order to properly calibrate the system and schedule power delivery. Thus, the ability to detect movement within the charging environment may have significant impact on the determination of how frequently the client beacons. One method of addressing this concern is to enable the client systems to include sensor components that can detect when they are moving.

One drawback to such a system, however, is that the device is responsible for determining movement, rather than the transmitter. Thus, if the device is not equipped with accelerometers, or other suitable movement sensors, or if there is a failure of these systems, then the transmitter will be unaware if there is movement within the environment.

Thus, it is desirable for the transmitter to be able to determine if there is movement of a charger device. Movement may be detected in a variety of ways. In the most sophisticated of systems, the angle of incidence of the beacon signal may be calculated, as previously discussed, and changes in angles of incidences indicates movement of the device.

Alternatively, in a system where the direction determining antenna array may be monitored continuously, non-static phase information may be used to determine that the power receiving appliance is in motion. Although it may not be possible to decide if the receiver is moving or the environment is in motion in the short term, over a longer period it may be possible to resolve the continuous phase change into a velocity. In the case where a power receiving system is moving toward or away from the transmitter that is providing the charging signal, the trend of the signal amplitude change may also be used to establish the likely movement of the power receiving appliance.

Figure 10A:
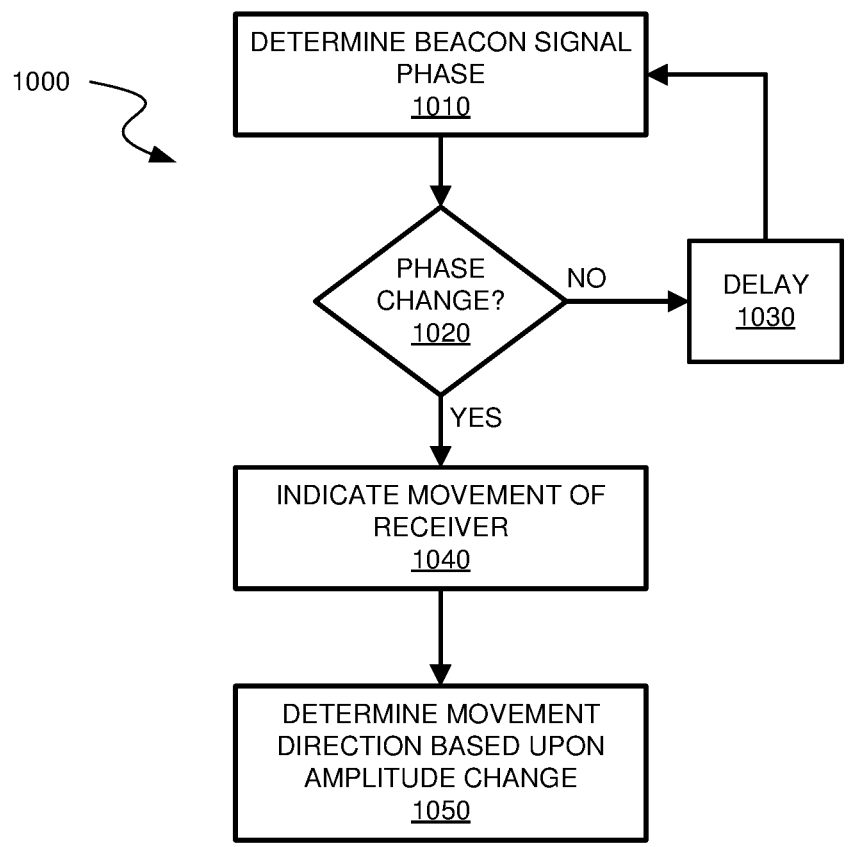
FIGS. 10A and 10B depict flow diagrams illustrating example processes for determining client movement within the charging environment.
Figure 10B:
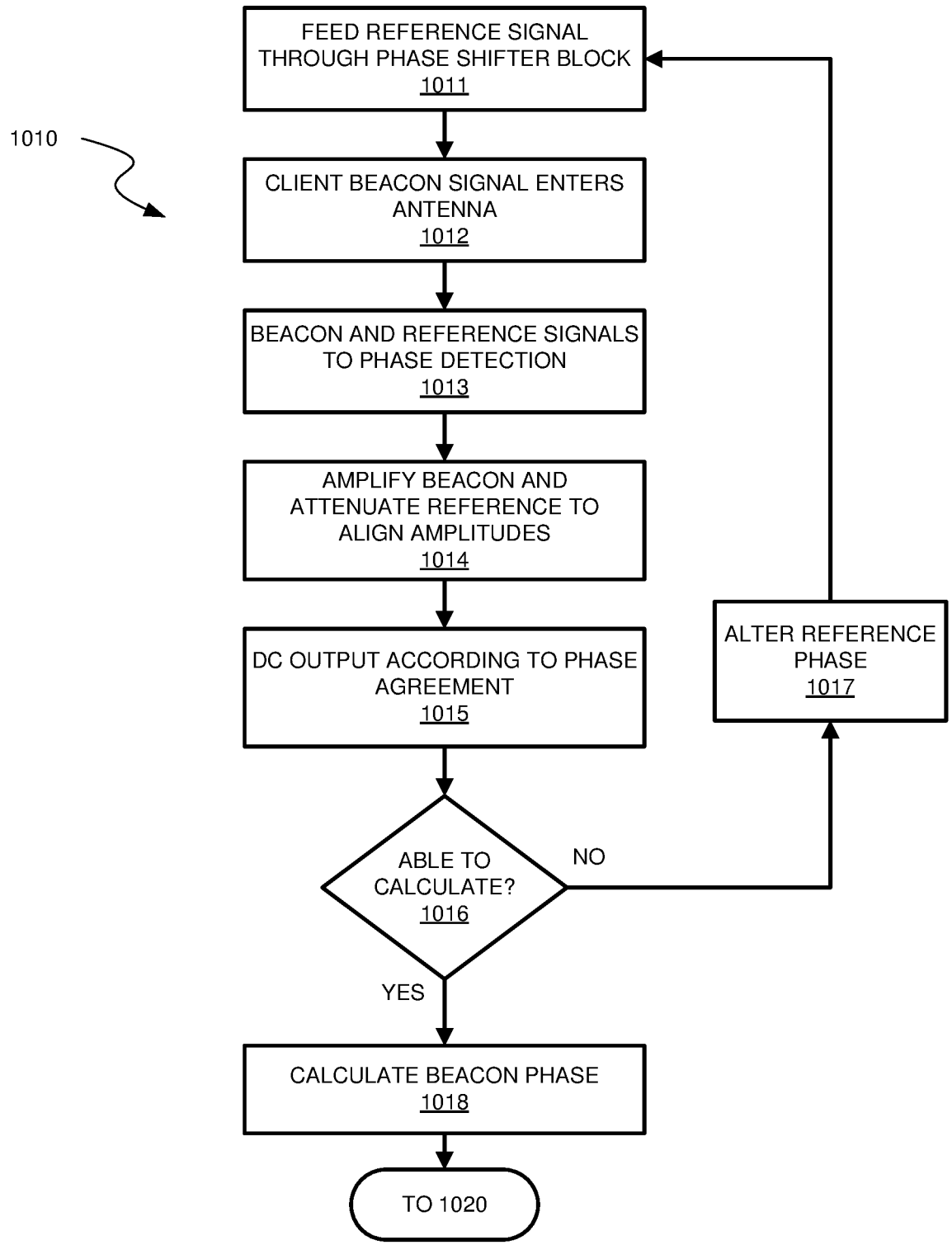

FIG. 10A provides a flow diagram of one example process 1000 of determining client movement within the charging environment. Initially, the method determines the beacon signal's phase from a device, at 1010. One other possible approach for the mechanism for determining beacon phase is described in greater detail in reference to FIG. 10B. However, one will quickly note that this process is similar to that described in the previous section, and as such a number of details shall be omitted for simplicity.

Like prior processes, the reference signal is initially fed through a phase shifter block, at 1011, to modulate the phase. The client beacon enters the antenna, at 1012, and the two signals are sent to a phase detection circuit, at 1013, where they are attenuated to have similar amplitudes, at 1014. The result of this comparison is a DC output, at 1015, in accordance with the degree of similarity between the phases of the signals. Next a determination is made if there is sufficient data available to determine the phase, at 1016.

If so, the beacon phase is calculated, at 1018 and the process return to step 1020 of FIG. 10A. Otherwise, the reference signals phase is altered within the phase shifter block, at 1017, and the process is repeated.

At 1020 of FIG. 10A, a determination is made on whether there has been a significant change in phase for the client device since the last time the phase was measured. If not, the system may wait a set length of time, at 1030, and the beacon phase is again retested. However, if at any point there is a phase change detected, the process indicates that the receiver (and/or environment) is moving, at 1040. Based upon amplitude, the direction of the phase shift may also be estimated, at 1050.

Once movement has been detected by the system additional steps may be taken to ensure better charger performance. For example, in some embodiments, if one device is determined to be moving, it may be desirable to require more frequent beaconing of the device in order to make effective power schedules.

In addition to being able to detect the movement of a client device within the charging environment, it may likewise be beneficial to be able to detect movement of the environment itself. A person walking within the environment, or the movement of an article within the environment, will dramatically alter the transmission pathways between the client and the receiver. Thus, even if the client is stationary, the ability to detect movement within the charging environment may have significant impact on the determination of how frequently the client beacons.

In order to accomplish this determination, the charger is assumed to be stationary. The client device may either be a stationary device, such as a monitor, other large appliance, or a fixture within the building (i.e., a thermostat, security system, etc.). Alternatively, the client may be a mobile type device, such as a cellular phone, with independent means for motion detection (i.e., accelerometer feedback). In these cases, the device, although capable of being moved, can determine that it is in a stationary position.

The receiver device then monitors the incoming power transmissions for phase variance over time, much in the same manner that the charger device in the previous section monitors the beacon signal for phase change. However, unlike the above situation where the charger is responsible for detecting phase variances, the presently disclosed techniques can pinpoint alterations in phase to identify that there is movement within the environment between the charger and receiver (since both charger and receiver are presumed to be stationary themselves).

Alternatively, where it is unknown whether the receiver is stationary or not, the receiver may still analyze incoming transmissions to identify phase variances over time. When detected, the receiver is able to determine that something in the environment has changed, or that the receiver itself is moving. If data is collected from multiple receivers, and some of them indicate no changes in phase, a probabilistic determination may be made whether the perceived phase shifting by a receiver is due to receiver movement itself, or movement of some other object within the environment.

The client device that is capable of making such a determination may provide this information to the charger, and in a sufficiently data rich environment (multiple clients compiling movement data) a virtual map of the environment may be generated where client devices that are stationary are identified, and the general regions of the moving body are likewise identified. Over time this data may be utilized to identify patters of user behaviors which may further be utilized to refine powering schedules.

In some embodiments, a method for identifying movement of a client within a charging environment is disclosed. The method includes calculating a phase for a beacon signal originating from a client, comparing the calculated phase to previous phase calculations, and identifying client movement when the calculated phase does not match the previous phase calculations.

In some embodiments, calculating the phase includes collecting three reference signals with known phases, detecting the beacon signal, adjusting the amplitudes of the reference signals and the beacon signal until the amplitudes are roughly aligned, comparing each of the three reference signals to the beacon signal to generate direct current outputs, and calculating the beacon signal's phase using the known phases and corresponding direct current outputs.

In some embodiments, the method further includes determining direction of client movement based upon beacon signal amplitude.

In some embodiments, a lower amplitude for the beacon signal compared to previously measured signals indicates the client traveling away from a transmitter. Likewise, a greater amplitude for the beacon signal compared to previously measured signals indicates the client traveling toward a transmitter.

In some embodiments, client beacon transmission frequency is increased upon identification of client movement.

In some embodiments, the method further includes shifting a directional beam transmission away from the client upon identification of client movement.

In some embodiments, a method for identifying movement within a charging environment is disclosed. The method includes calculating a phase for a signal originating from a charger, comparing the calculated phase to previous phase calculations, and identifying movement when the calculated phase does not match the previous phase calculations.

In some embodiments, calculating the phase includes collecting three reference signals with known phases, detecting the signal, adjusting the amplitudes of the reference signals and the signal until the amplitudes are roughly aligned, comparing each of the three reference signals to the signal to generate direct current outputs, and calculating the signal's phase using the known phases and corresponding direct current outputs.

In some embodiments, the method further includes increasing client beacon transmission frequency upon identification of movement.

Figure 11:
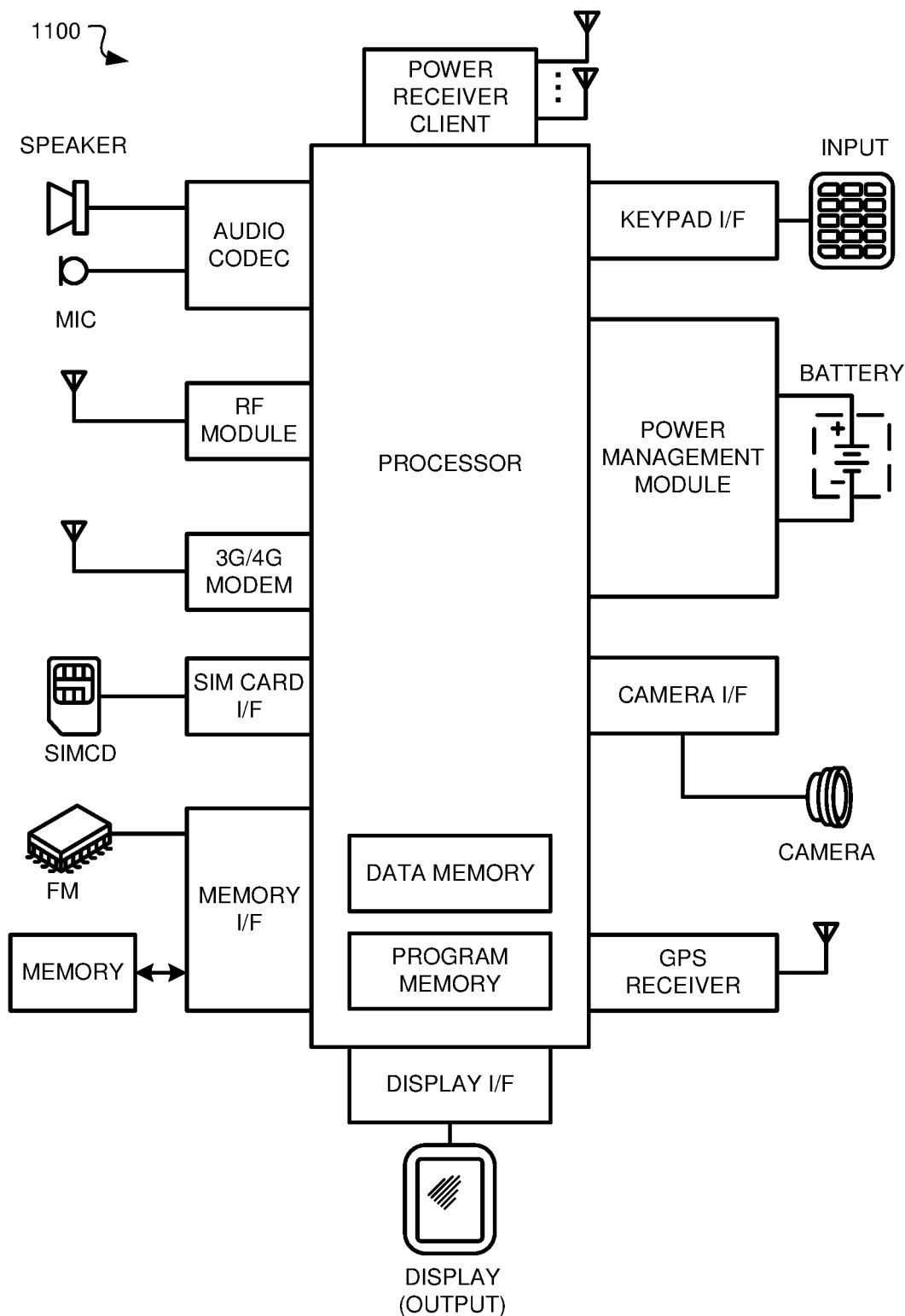
FIG. 11 depicts a block diagram illustrating example components of a representative mobile device or tablet computer with one or more wireless power receiver clients in the form of a mobile (or smart) phone or tablet computer device in accordance with some embodiments.

FIG. 11 depicts a block diagram illustrating example components of a representative mobile device or tablet computer 1100 with a wireless power receiver or client in the form of a mobile (or smart) phone or tablet computer device, according to an embodiment. Various interfaces and modules are shown with reference to FIG. 11, however, the mobile device or tablet computer does not require all of modules or functions for performing the functionality described herein. It is appreciated that, in many embodiments, various components are not included and/or necessary for operation of the category controller. For example, components such as GPS radios, cellular radios, and accelerometers may not be included in the controllers to reduce costs and/or complexity. Additionally, components such as ZigBee radios and RFID transceivers, along with antennas, can populate the Printed Circuit Board.

The wireless power receiver client can be a power receiver client 103 of FIG. 1, although alternative configurations are possible. Additionally, the wireless power receiver client can include one or more RF antennas for reception of power and/or data signals from a power transmission system, e.g., wireless power transmission system 101 of FIG. 1.

Figure 12:
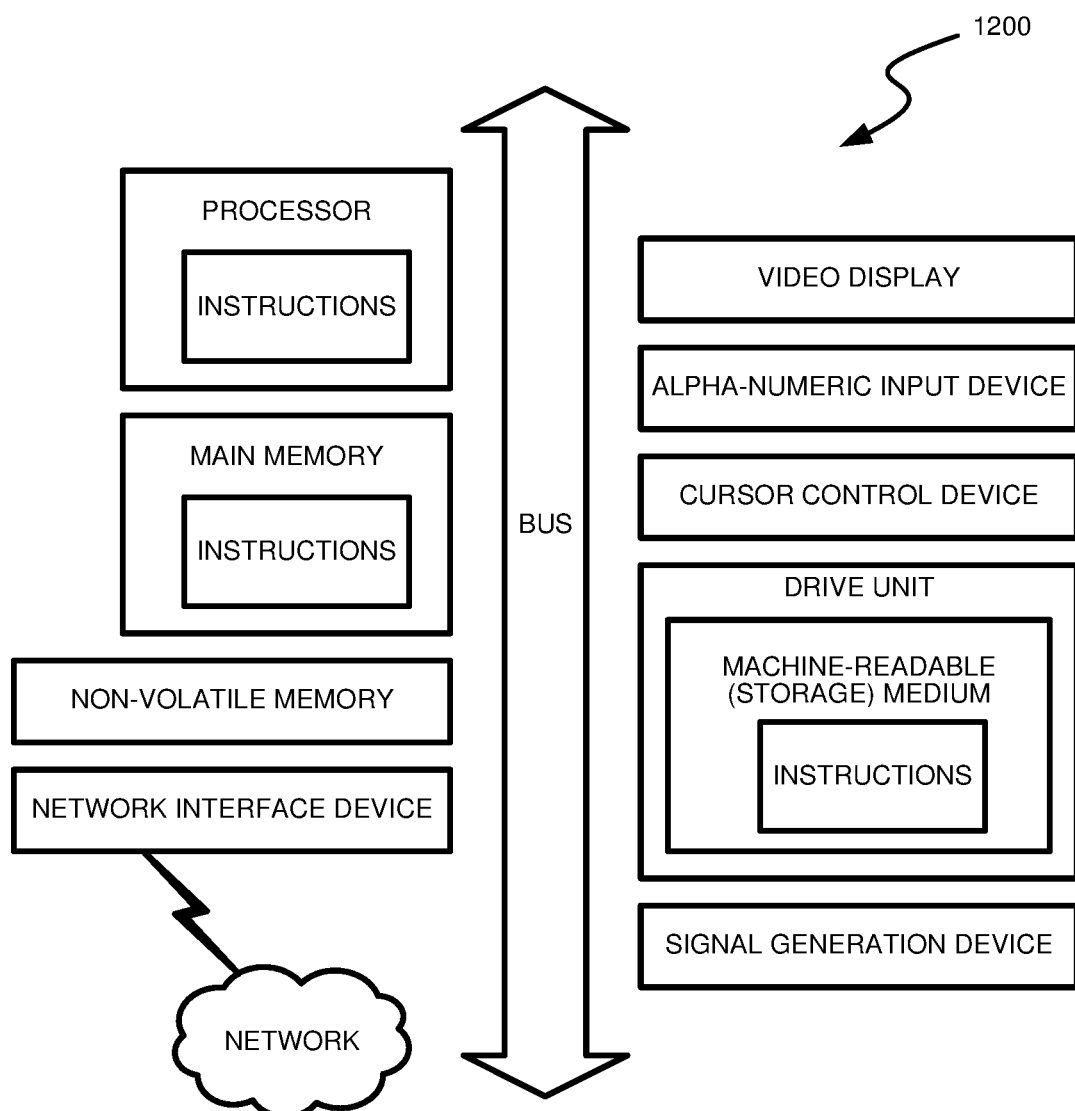
FIG. 12 depicts a diagrammatic representation of a machine, in the example form, of a computer system within which a set of instructions, for causing the machine to perform any one or more of the methodologies discussed herein, may be executed.

FIG. 12 depicts a diagrammatic representation of a machine, in the example form, of a computer system within which a set of instructions, for causing the machine to perform any one or more of the methodologies discussed herein, may be executed.

In the example of FIG. 12, the computer system includes a processor, memory, non-volatile memory, and an interface device. Various common components (e.g., cache memory) are omitted for illustrative simplicity. The computer system 1200 is intended to illustrate a hardware device on which any of the components depicted in the example of FIG. 1 (and any other components described in this specification) can be implemented. For example, the computer system can be any radiating object or antenna array system. The computer system can be of any applicable known or convenient type. The components of the computer system can be coupled together via a bus or through some other known or convenient device.

The processor may be, for example, a conventional microprocessor such as an Intel Pentium microprocessor or Motorola power PC microprocessor. One of skill in the relevant art will recognize that the terms "machine-readable (storage) medium" or "computer-readable (storage) medium" include any type of device that is accessible by the processor.

The memory is coupled to the processor by, for example, a bus. The memory can include, by way of example but not limitation, random access memory (RAM), such as dynamic RAM (DRAM) and static RAM (SRAM). The memory can be local, remote, or distributed.

The bus also couples the processor to the non-volatile memory and drive unit. The non-volatile memory is often a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory during execution of software in the computer 1200. The non-volatile storage can be local, remote, or distributed. The non-volatile memory is optional because systems can be created with all applicable data available in memory. A typical computer system will usually include at least a processor, memory, and a device (e.g., a bus) coupling the memory to the processor.

Software is typically stored in the non-volatile memory and/or the drive unit. Indeed, for large programs, it may not even be possible to store the entire program in the memory. Nevertheless, it should be understood that for software to run, if necessary, it is moved to a computer readable location appropriate for processing, and for illustrative purposes, that location is referred to as the memory in this paper. Even when software is moved to the memory for execution, the processor will typically make use of hardware registers to store values associated with the software, and local cache that, ideally, serves to speed up execution. As used herein, a software program is assumed to be stored at any known or convenient location (from non-volatile storage to hardware registers) when the software program is referred to as "implemented in a computer-readable medium". A processor is considered to be "configured to execute a program" when at least one value associated with the program is stored in a register readable by the processor.

The bus also couples the processor to the network interface device. The interface can include one or more of a modem or network interface. It will be appreciated that a modem or network interface can be considered to be part of the computer system. The interface can include an analog modem, isdn modem, cable modem, token ring interface, satellite transmission interface (e.g. "direct PC"), or other interfaces for coupling a computer system to other computer systems. The interface can include one or more input and/or output devices. The I/O devices can include, by way of example but not limitation, a keyboard, a mouse or other pointing device, disk drives, printers, a scanner, and other input and/or output devices, including a display device. The display device can include, by way of example but not limitation, a cathode ray tube (CRT), liquid crystal display (LCD), or some other applicable known or convenient display device. For simplicity, it is assumed that controllers of any devices not depicted in the example of FIG. 12 reside in the interface.

In operation, the computer system 1200 can be controlled by operating system software that includes a file management system, such as a disk operating system. One example of operating system software with associated file management system software is the family of operating systems known as Windows® from Microsoft Corporation of Redmond, Wash., and their associated file management systems. Another example of operating system software with its associated file management system software is the Linux operating system and its associated file management system. The file management system is typically stored in the non-volatile memory and/or drive unit and causes the processor to execute the various acts required by the operating system to input and output data and to store data in the memory, including storing files on the non-volatile memory and/or drive unit.

Some portions of the detailed description may be presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms and displays presented herein are not inherently related to any particular computer or other apparatus. Various general purpose systems may be used with programs in accordance with the teachings herein, or it may prove convenient to construct more specialized apparatus to perform the methods of some embodiments. The required structure for a variety of these systems will appear from the description below. In addition, the techniques are not described with reference to any particular programming language, and various embodiments may thus be implemented using a variety of programming languages.

In alternative embodiments, the machine operates as a standalone device or may be connected (e.g., networked) to other machines. In a networked deployment, the machine may operate in the capacity of a server or a client machine in a client-server network environment or as a peer machine in a peer-to-peer (or distributed) network environment.

The machine may be a server computer, a client computer, a personal computer (PC), a tablet PC, a laptop computer, a set-top box (STB), a personal digital assistant (PDA), a cellular telephone, an iPhone, a Blackberry, a processor, a telephone, a web appliance, a network router, switch or bridge, or any machine capable of executing a set of instructions (sequential or otherwise) that specify actions to be taken by that machine.

While the machine-readable medium or machine-readable storage medium is shown in an exemplary embodiment to be a single medium, the term "machine-readable medium" and "machine-readable storage medium" should be taken to include a single medium or multiple media (e.g., a centralized or distributed database, and/or associated caches and servers) that store the one or more sets of instructions. The term "machine-readable medium" and "machine-readable storage medium" shall also be taken to include any medium that is capable of storing, encoding or carrying a set of instructions for execution by the machine and that cause the machine to perform any one or more of the methodologies of the presently disclosed technique and innovation.

In general, the routines executed to implement the embodiments of the disclosure, may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processing units or processors in a computer, cause the computer to perform operations to execute elements involving the various aspects of the disclosure.

Moreover, while embodiments have been described in the context of fully functioning computers and computer systems, those skilled in the art will appreciate that the various embodiments are capable of being distributed as a program product in a variety of forms, and that the disclosure applies equally regardless of the particular type of machine or computer-readable media used to actually effect the distribution.

Further examples of machine-readable storage media, machine-readable media, or computer-readable (storage) media include but are not limited to recordable type media such as volatile and non-volatile memory devices, floppy and other removable disks, hard disk drives, optical disks (e.g., Compact Disk Read-Only Memory (CD ROMS), Digital Versatile Disks, (DVDs), etc.), among others, and transmission type media such as digital and analog communication links.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the disclosure is not intended to be exhaustive or to limit the teachings to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are, at times, shown as being performed in a series, these processes or blocks may instead be performed in parallel, or may be performed at different times. Further, any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

Any patents and applications and other references noted above, including any that may be listed in accompanying filing papers, are incorporated herein by reference. Aspects of the disclosure can be modified, if necessary, to employ the systems, functions, and concepts of the various references described above to provide yet further embodiments of the disclosure.

These and other changes can be made to the disclosure in light of the above Detailed Description. While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the disclosure to the specific embodiments disclosed in the specification, unless the above Detailed Description section explicitly defines such terms. Accordingly, the actual scope of the disclosure encompasses not only the disclosed embodiments, but also all equivalent ways of practicing or implementing the disclosure under the claims.

While certain aspects of the disclosure are presented below in certain claim forms, the inventors contemplate the various aspects of the disclosure in any number of claim forms. For example, while only one aspect of the disclosure is recited as a means-plus-function claim under 35 U.S.C. § 112, ¶6, other aspects may likewise be embodied as a means-plus-function claim, or in other forms, such as being embodied in a computer-readable medium. (Any claims intended to be treated under 35 U.S.C. § 112, ¶6 will begin with the words "means for".) Accordingly, the applicant reserves the right to add additional claims after filing the application to pursue such additional claim forms for other aspects of the disclosure.

The detailed description provided herein may be applied to other systems, not necessarily only the system described above. The elements and acts of the various examples described above can be combined to provide further implementations of the invention. Some alternative implementations of the invention may include not only additional elements to those implementations noted above, but also may include fewer elements. These and other changes can be made to the invention in light of the above Detailed Description. While the above description defines certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention.

What is claimed is:

1. A wireless power transmission system comprising:
   an antenna array having multiple radio frequency (RF) antennas; and
   control circuitry operatively coupled to the antenna array and configured to:
      detect, at one or more antennas of the multiple RF antennas, an incoming beacon signal delivered from and initiated by a wireless power receiver client; and
      determine, during a detection cycle, a phase of the incoming beacon signal at each of the one or more antennas of the multiple RF antennas, including, for each antenna:
         comparing the incoming beacon signal to a reference signal that is phase shifted through multiple phases during the detection cycle via a two-stage switched transmission line phase shifter;
         generating an output signal that indicates a degree of phase alignment between the incoming beacon signal and the reference signal; and
         determining the phase that the incoming beacon signal is received at the antenna based on the output signal.

2. The wireless power transmission system of claim 1, wherein determining the phase that the incoming beacon signal is received at the antenna includes:
   sampling the output signal over at a plurality of one or more of the multiple phases of the comparison between the incoming beacon signal and the reference signal; and
   determine that sufficient samples exist for determining the phase that the incoming beacon signal is received.

3. The wireless power transmission system of claim 1, wherein the control circuitry is further configured to, for each of the one or more antennas:
   process the phase that the incoming beacon signal is received to determine a transmit phase for delivering directed wireless power to the wireless power receiver client from the antenna.

4. The wireless power transmission system of claim 3, wherein the control circuitry is further configured to, for each antenna of the one or more antennas:
   configure the antenna using the determined transmit phase; and
   direct the antenna to deliver directed wireless power to the wireless power receiver client.

5. The wireless power transmission system of claim 1, wherein the output signal comprises a Direct Current (DC) value indicating a phase difference between the incoming beacon signal and the reference signal.

6. The wireless power transmission system of claim 5, wherein a maximum DC value occurs when the incoming beacon signal and the reference signal are in phase and a minimum DC value when the signals are 180-degrees out of phase.

7. The wireless power transmission system 1, wherein determining the phase that the incoming beacon signal is received comprises normalizing an amplitude of at least one of the incoming signal or the reference signal.

8. The wireless power transmission system of claim 1, wherein comparing the incoming beacon signal to the reference signal that is phase shifted through multiple phases comprises combining the incoming beacon signal and the reference signal.

9. The wireless power transmission system of claim 1, wherein the output signal further indicates a degree of amplitude alignment between the incoming beacon signal and the reference signal.

10. The wireless power transmission system of claim 1, wherein the two-stage switched transmission line phase shifter includes a 360-degree phase shift range in 22.5-degree step sizes.

11. A phase detection apparatus comprising:
   a phase shifting component including circuitry adapted to phase-shift a reference signal through multiple phases each detection cycle; and
   a phase detector component including circuitry adapted to determine a phase of an incoming beacon signal at each of one or more antennas of an antenna array during each detection cycle, including, for each of the one or more antennas:
      comparing the incoming beacon signal to the multiple phases of the reference signal that is phase shifted through the multiple phases;
      generating an output signal that indicates a degree of phase alignment between the incoming beacon signal and the reference signal; and
      determining the phase that the incoming beacon signal is received at the antenna based on the output signal.

12. The phase detection apparatus of claim 11,
wherein the multiple phases are generated by sending the reference signal through one or more switches, and
wherein each switch is coupled to at least three phase shifters.

13. The phase detection system of claim 11, wherein the output signal comprises a Direct Current (DC) value indicating a phase difference between the incoming beacon signal and the reference signal.

14. The phase detection system of claim 13, wherein the phase of the incoming beacon signal is determined using a model:

$$\begin{bmatrix} P_{k1} \\ P_{k2} \\ P_{k3} \end{bmatrix} = \begin{bmatrix} 1 & \cos(\theta_1) & \sin(\theta_1) \\ 1 & \cos(\theta_2) & \sin(\theta_2) \\ 1 & \cos(\theta_3) & \sin(\theta_3) \end{bmatrix} \begin{bmatrix} A \\ B \\ C \end{bmatrix}$$

where $P_{k1}$, $P_{k2}$ and $P_{k3}$ are samples of the DC output signal, wherein $\theta_{1,2,3}$ are the known phases, A, B, C are solved for; and $\hat{\theta}_k = \arctan_2(C, B)$, where $\hat{\theta}_k$ is the phase of the incoming signal.

15. The phase detector of claim 11, wherein to determine the phase of the incoming beacon signal during a detection cycle, the circuitry is further adapted to:
normalize an amplitude of at least one of the incoming beacon signal or the reference signal.

16. A method for determining a phase of an incoming beacon signal during a detection cycle at each of one or more antennas of an antenna array, the method comprising:
for each of the one or more antennas of the antenna array,
comparing the incoming beacon signal to a reference signal that is phase shifted through multiple phases during the detection cycle via a two-stage switched transmission line phase shifter;
generating an output signal that indicates a degree of phase alignment between the incoming beacon signal and the reference signal; and
determining the phase that the incoming beacon signal is received at the antenna based on the output signal.

17. The method of claim 16, further comprising, for each of the one or more antennas:
processing the phase that the incoming beacon signal is received at the antenna to determine a corresponding transmit phase for delivering directed wireless power to a wireless power receiver client from the antenna,
wherein the incoming beacon signal is delivered from and initiated by the wireless power receiver client;
configuring the antenna using the determined transmit phase; and
directing the antenna to deliver directed wireless power to the wireless power receiver client.

18. The method of claim 16, wherein the output signal comprises a Direct Current (DC) value indicating a phase difference between the incoming beacon signal and the reference signal, and wherein a maximum DC value occurs when the incoming beacon signal and the reference signal are in phase and a minimum DC value when the signals are 180-degrees out of phase.

19. The method of 16, wherein determining the phase that the incoming beacon signal is received at the antenna comprises:
sampling the output signal over at a plurality of one or more of the multiple phases of the comparison between the incoming beacon signal and the reference signal; and
determine that sufficient samples exist for determining the phase that the incoming beacon signal is received.

20. The method of claim 16, wherein the two-stage switched transmission line phase shifter includes a 360-degree phase shift range in 22.5-degree step sizes.

* * * * *